(12) United States Patent
Matsui

(10) Patent No.: US 8,908,734 B2
(45) Date of Patent: Dec. 9, 2014

(54) DIRECTLY MODULATED LASER FOR PON APPLICATIONS

(71) Applicant: Finisar Corporation, Sunnyvale, CA (US)

(72) Inventor: Yasuhiro Matsui, Milpitas, CA (US)

(73) Assignee: Finisar Corporation, Sunnyvale, CA (US)

( * ) Notice: Subject to any disclaimer, the term of this patent is extended or adjusted under 35 U.S.C. 154(b) by 19 days.

(21) Appl. No.: 13/897,282

(22) Filed: May 17, 2013

(65) Prior Publication Data

US 2013/0308959 A1    Nov. 21, 2013

Related U.S. Application Data

(60) Provisional application No. 61/648,499, filed on May 17, 2012.

(51) Int. Cl.

| | |
|---|---|
| *H01S 5/00* | (2006.01) |
| *H01S 5/0625* | (2006.01) |
| *H01S 5/20* | (2006.01) |
| *H04B 10/50* | (2013.01) |
| *H01S 5/12* | (2006.01) |
| *H01S 5/026* | (2006.01) |
| *H01S 5/34* | (2006.01) |
| *H01S 5/062* | (2006.01) |
| *H01S 5/343* | (2006.01) |
| *H01S 5/022* | (2006.01) |

(52) U.S. Cl.
CPC ............... *H01S 5/0085* (2013.01); *H01S 5/026* (2013.01); *H01S 5/3416* (2013.01); *H01S 5/0035* (2013.01); *H01S 5/06256* (2013.01); *H01S 5/20* (2013.01); *H01S 5/3415* (2013.01); *H01S 5/0265* (2013.01); *H01S 5/06226* (2013.01); *H04B 10/504* (2013.01); *H01S 5/34306* (2013.01); *H01S 5/1221* (2013.01); *H01S 5/02276* (2013.01)

USPC ................. 372/45.01; 372/50.11; 372/50.1; 372/43.01

(58) Field of Classification Search
CPC ......... H01S 5/12; H01S 5/125; H01S 5/2018; H01S 5/2022; H01S 5/32; H01S 5/32358; H01S 5/06256; H01S 5/06258
USPC .................. 372/50.11, 50.1, 45.01, 43.01
See application file for complete search history.

(56) References Cited

U.S. PATENT DOCUMENTS

| | | | |
|---|---|---|---|
| 6,836,357 B2 * | 12/2004 | Wang et al. | 359/344 |
| 2010/0265980 A1 * | 10/2010 | Matsuda | 372/46.01 |

* cited by examiner

*Primary Examiner* — Kinam Park
(74) *Attorney, Agent, or Firm* — Maschoff Brennan

(57) ABSTRACT

In an embodiment, a distributed Bragg reflector (DBR) laser includes a gain section and a passive section. The gain section includes an active region, an upper separate confinement heterostructure (SCH), and a lower SCH. The upper SCH is above the active region and has a thickness of at least 60 nanometers (nm). The lower SCH is below the active region and has a thickness of at least 60 nm. The passive section is coupled to the gain section, the passive section having a DBR in optical communication with the active region.

20 Claims, 26 Drawing Sheets

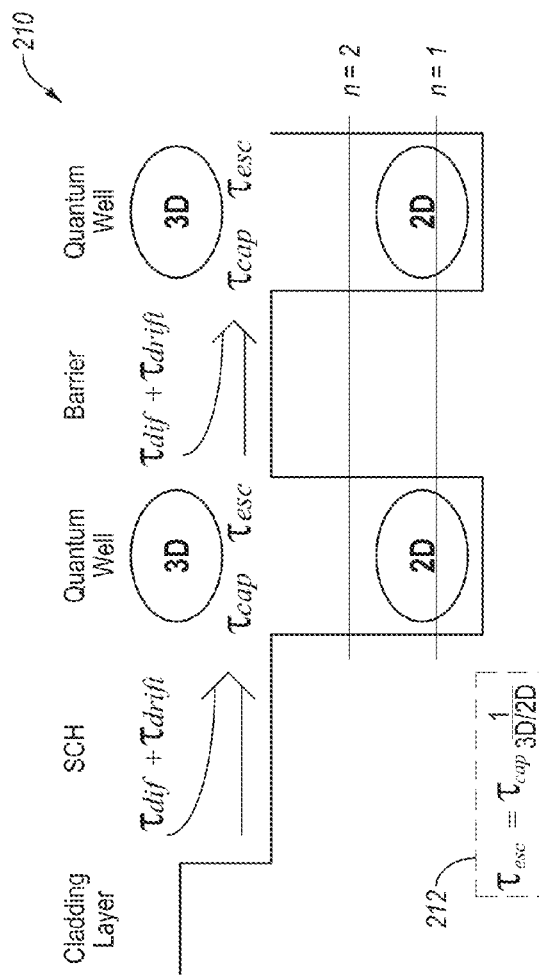

DIRECTLY MODULATED LASER FOR PON APPLICATIONS

CROSS-REFERENCE TO RELATED APPLICATIONS

This patent application claims the benefit of and priority to U.S. Provisional Patent Application Ser. No. 61/648,499, filed May 17, 2012, which is incorporated herein by reference.

FIELD

The embodiments discussed herein relate to an optical transmitter including a directly modulated laser (DML).

BACKGROUND

Lasers have become useful in a number of applications. For example, lasers may be used in optical communications to transmit digital data across a fiber-optic network. Directly modulated lasers (DMLs) may be modulated by a modulation signal, such as an electronic digital signal, to produce an optical signal transmitted on a fiber-optic cable. An optically sensitive device, such as a photodiode, is used to convert the optical signal to an electronic digital signal transmitted through the fiber-optic network. Such fiber-optic networks enable modern computing devices to communicate at high speeds and over long distances.

In fiber-optic networks, DMLs are typically implemented as directly modulated distributed feedback (DFB) lasers. Direct amplitude modulation (AM) of DFB lasers and other semiconductor lasers also results in frequency modulation (FM) of the DFB. At high-speeds, e.g., data rates over 10 gigabits per second (G), The FM component of a high-speed optical signal generated by a DFB laser closes the eye after transmission through dispersive fiber such that the reach of a 10 G DFB laser is typically limited to about 5-10 kilometers (km).

The subject matter claimed herein is not limited to embodiments that solve any disadvantages or that operate only in environments such as those described above. Rather, this background is only provided to illustrate one exemplary technology area where some embodiments described herein may be practiced.

BRIEF SUMMARY OF SOME EXAMPLE EMBODIMENTS

Embodiments described herein generally relate to a directly modulated distributed Bragg reflector (DBR) laser.

In an example embodiment, a DBR laser includes a gain section and a passive section. The gain section includes an active region, an upper separate confinement heterostructure (SCH), and a lower SCH. The upper SCH is above the active region and has a thickness of at least 60 nanometers (nm). The lower SCH is below the active region and has a thickness of at least 60 nm. The passive section is coupled to the gain section, the passive section having a DBR in optical communication with the active region.

In another example embodiment, an optical transmitter includes a direct modulation source, a high-pass electrical filter, and a DBR laser. The high-pass electrical filter is coupled to the direct modulation source. The high-pass electrical filter has a time constant on the order of 1 nanosecond (ns). The DBR laser is coupled to the high-pass electrical filter. The DBR laser includes a gain section and a passive section. The gain section includes an active region, an upper SCH, and a lower SCH. The upper SCH is above the active region and has a thickness of at least 60 nm. The lower SCH is below the active region and has a thickness of at least 60 nm. The passive section is coupled to the gain section, the passive section having a DBR in optical communication with the active region.

In yet another example embodiment, a distributed feedback (DFB) laser includes a gain section. The gain section includes an active region, an upper SCH, and a lower SCH. The upper SCH is above the active region and has a thickness of at least 60 nm. The lower SCH is below the active region and has a thickness of at least 60 nm. The gain section is biased with a relatively high bias current density of at least 0.2 milli amps (mA) per micrometer (um).

Additional features and advantages of the invention will be set forth in the description which follows, and in part will be obvious from the description, or may be learned by the practice of the invention. The features and advantages of the invention may be realized and obtained by means of the instruments and combinations particularly pointed out in the appended claims. These and other features of the present invention will become more fully apparent from the following description and appended claims, or may be learned by the practice of the invention as set forth hereinafter.

BRIEF DESCRIPTION OF THE DRAWINGS

To further clarify the above and other advantages and features of the present invention, a more particular description of the invention will be rendered by reference to specific embodiments thereof which are illustrated in the appended drawings. Understanding that these drawings depict only several embodiments in accordance with the disclosure and are, therefore, not to be considered limiting of its scope, the disclosure will be described with additional specificity and detail through use of the accompanying drawings, in which:

FIG. 2A illustrates a rate equations model for a laser, such as the DBR lasers of FIGS. 1A-1D;

FIG. 2B shows a model of a theoretical simulation to investigate carrier transport effect;

DETAILED DESCRIPTION OF SOME EXAMPLE EMBODIMENTS

Embodiments described herein generally relate to high-speed directly modulated lasers (DMLs) with reach of 20 km or more and/or which may be suitable for passive optical network (PON) applications. Example embodiments may include distributed feedback (DFB) and/or distributed Bragg reflector (DBR) lasers with relatively thick SCH to damp ringing in a frequency response of the lasers. Alternately or additionally, example embodiments may include laser chips including a laser and an integrated optical amplifier that are co-modulated with the same modulation signal.

Reference will now be made to the drawings to describe various aspects of example embodiments of the invention. It is to be understood that the drawings are diagrammatic and schematic representations of such example embodiments, and are not limiting of the present invention, nor are they necessarily drawn to scale.

Figure 1A:
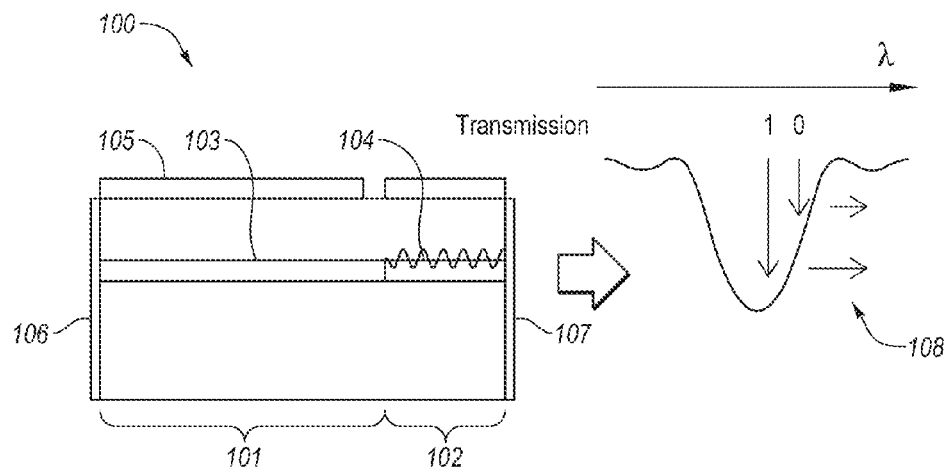
FIG. 1A illustrates an example embodiment of a distributed Bragg reflector (DBR) laser implemented as a front DBR laser.

FIG. 1A illustrates an example embodiment of a DBR laser 100, arranged in accordance with at least some embodiments described herein. In general, the DBR laser 100 includes a gain section 101 and a passive section 102. The gain section 101 includes an active region 103 such as a multiple quantum well (MQW) region. The passive section 102 is coupled to the gain section 101 and may include a DBR 104 in optical communication with the active region 103. The DBR laser 100 additionally includes a gain electrode 105 coupled to the gain section 101.

The DBR laser 100 may additionally include a high reflectivity (HR) coating 106 applied to a rear of the DBR laser 100 and/or an antireflection (AR) coating 107 applied to a front of the DBR laser 100.

As generally depicted at 108, the DBR laser 100 may be tuned to a long wavelength side of a Bragg peak associated with the DBR 104 operating in transmission. Direct modulation of the DBR laser 100 may generate an optical signal with both frequency modulation (FM) and amplitude modulation (AM). Accordingly, tuning the DBR laser 100 to the long wavelength side of the Bragg Peak may attenuate longer-wavelength zero bits less than shorter-wavelength one bits, thereby reducing the extinction ratio (ER) of the optical signal emerging from the front of the DBR laser 100 compared to the optical signal emitted by the gain section 101 as it enters the passive section 102.

The DBR laser 100 illustrated in FIG. 1A is an example of a front DBR laser, e.g., a DBR laser in which the passive section 102 including the DBR filter 104 is positioned between the gain section 101 and the front of the DBR laser 100. Embodiments described herein may additionally include rear DBR lasers and/or front/rear DBR lasers as illustrated in FIGS. 1B-1C.

Figure 1B:
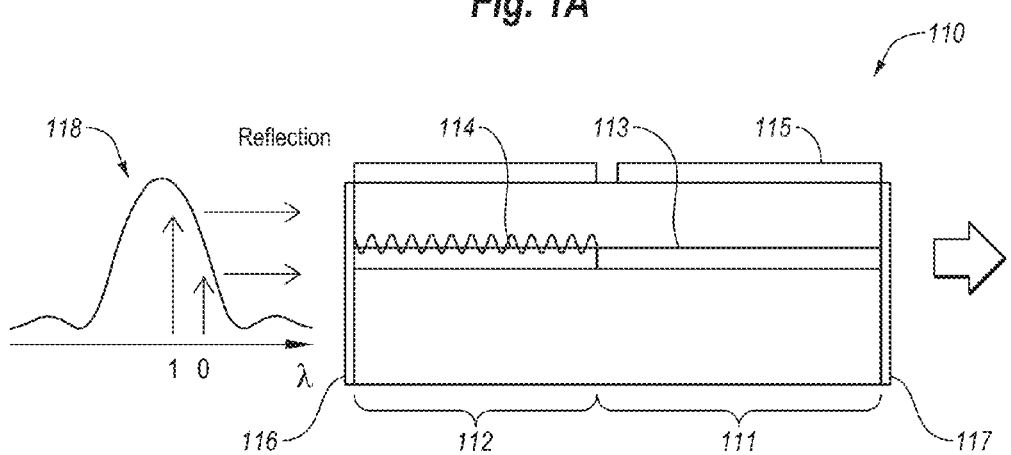
FIG. 1B illustrates an example embodiment of a DBR laser implemented as a rear DBR laser.
Figure 1C:
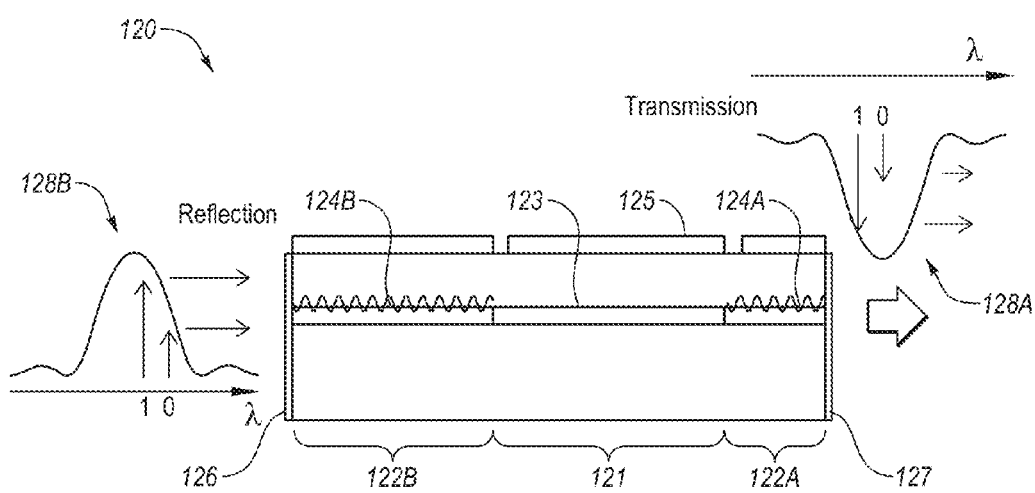
FIG. 1C illustrates an example embodiment of a DBR laser implemented as a front/rear DBR laser.

FIG. 1B illustrates an example embodiment of a DBR laser 110 implemented as a rear DBR laser, arranged in accordance with at least some embodiments described herein. The DBR laser 110 includes many components and/or structures that are analogous to corresponding components and/or structures of the DBR laser 100 of FIG. 1A. Briefly, for example, the DBR laser 110 includes a gain section 111 and a passive section 112. The gain section 111 includes an active region 113 such as a MQW region. The passive section 112 is coupled to the gain section 111 and may include a DBR 114 in optical communication with the active region 113.

The DBR laser 110 additionally includes a gain electrode 115 coupled to the gain section 111, an HR coating 116 applied to a rear of the DBR laser 110, and an AR coating applied to a front of the DBR laser 110. Because the DBR laser 110 is a rear DBR laser, the passive section 112 including the DBR 114 is positioned at the rear of the DBR laser 110 with the gain section 111 being positioned between the passive section 112 and the front of the DBR laser 110.

As generally depicted at 118, the DBR laser 110 may be tuned to a long wavelength side of a Bragg peak associated with the DBR 114 operating in reflection. In this example, tuning the DBR laser 110 to the long wavelength side of the Bragg Peak may attenuate longer-wavelength zero bits more than shorter-wavelength one bits, thereby enhancing the extinction ratio (ER) of the optical signal emerging from the front of the DBR laser 110 compared to the optical signal emitted by the gain section 111 as it enters the passive section 112.

In both front and rear DBR lasers, there is a natural tendency to lase on the long wavelength side of the associated Bragg peak due to cross gain compression (e.g., gain material non-linear effect). Additionally, short-cavity (SC) front or rear DBR lasers can be implemented in which lasing can be forced to happen on the short wavelength side of the Bragg peak. However, in both front and rear DBR lasers, the laser is faster on the long wavelength side of the Bragg peak. As will be explained in more detail below, the lasing position of the DBR with respect to the Bragg peak, or the tuning of the DBR laser, also referred to as the detune-loading effect, can be leveraged to improve the performance of the DBR laser.

FIG. 1C illustrates an example embodiment of a DBR laser 120 implemented as a front/rear DBR laser, arranged in accordance with at least some embodiments described herein. The DBR laser 120 includes many components and/or structures that are analogous to corresponding components and/or structures of the DBR lasers 100, 110 of FIGS. 1A and 1B. Briefly, for example, the DBR laser 120 includes a gain section 121, a front passive section 122A, and a rear passive section 122B. The gain section 121 includes an active region 123 such as a MQW region. The front passive section 122A is coupled to the gain section 121 and may include a front DBR 124A in optical communication with the active region 123. Analogously, the rear passive section 122B is coupled to the gain section 121 and may include a rear DBR 124B in optical communication with the active region 123. Because the DBR laser 120 is a front/rear DBR laser, gain section 121 may be positioned between the front passive section 122A including the DBR 124A and the rear passive section 122B including the DBR 124B.

The DBR laser 120 additionally includes a gain electrode 125 coupled to the gain section 121, an HR coating 126 applied to a rear of the DBR laser 120, and an AR coating applied to a front of the DBR laser 120. As generally depicted at 128A, the DBR laser 120 may be tuned to a short wavelength side of a Bragg peak associated with the front DBR 124A. As generally depicted at 128B, the DBR laser 120 may be tuned to a long wavelength side of a Bragg peak associated with the rear DBR 124B.

In some embodiments, the rear DBR filter 124B may have a relatively high reflectance of 90% or more, while the front DBR filter 124A may have a relatively low reflectance in a range from 5% to 30%. A lasing mode of the DBR laser 120 may be controlled by adjusting relative phases of the front and rear DBR filters 124A-124B. With an appropriate relative phase shift, yield for single mode lasing may be increased to nearly 100%. In these and other embodiments, a side-mode suppression ratio (SMSR) may be mainly determined by the rear DBR filter 124B with the higher reflectivity which therefore provides larger difference in threshold gain for main mode and second side mode. The Bragg peak of the front DBR filter 124A may be shifted to the shorter wavelength side as already described above so that the ER after passage through the front DBR filter 124A increases the ER, and without degrading SMSR since SMSR is mainly determined by the rear DBR filter 124B. Optionally, the active region 123 may include a grating at the center in order to improve SMSR and single mode yield, in which case the DBR laser 120 may instead be implemented as a distributed Bragg (DR) laser. The detune-loading effect may be reduced since dynamic change in threshold gain will be reduced by the presence of the grating in the active region 123.

As already described above, each of the DBR lasers 100, 110, 120 of FIGS. 1A-1C includes a gain electrode 105, 115, 125 coupled to a corresponding gain section 101, 111, 121. The gain electrode 105, 115, 125 is configured to be coupled to a direct modulation source (not shown), such as a laser driver. The direct modulation source may provide a modulation signal having a data rate of about 10 gigabits per second ("G") or higher. As used herein, the term "about" as applied to a value may be interpreted as the value plus or minus 10% of the value. Thus, the gain section 101, 111, 121 may be directly modulated by a modulation signal having a data rate of about 10 G or higher. More generally, all of the lasers described herein may be modulated at a data rate of about 10 G or higher.

In these and other embodiments, the modulation signal applied to the gain section 101, 111, 121 may have a modulation swing of at least 40 milli amps peak-to-peak (mApp) and/or the gain section 101, 111, 121 may have a length of 300 micrometers (um) or less. In an example implementation, the modulation swing may be about 60 mApp and the gain section 101, 111, 121 may have a length of about 200 um. As another example, the modulation swing may be 90 mApp or more. Alternately or additionally, a modulation density—defined as the modulation swing divided by the length of the gain section 101, 111, 121—may be 0.2 mApp/um or more.

Figure 1D:
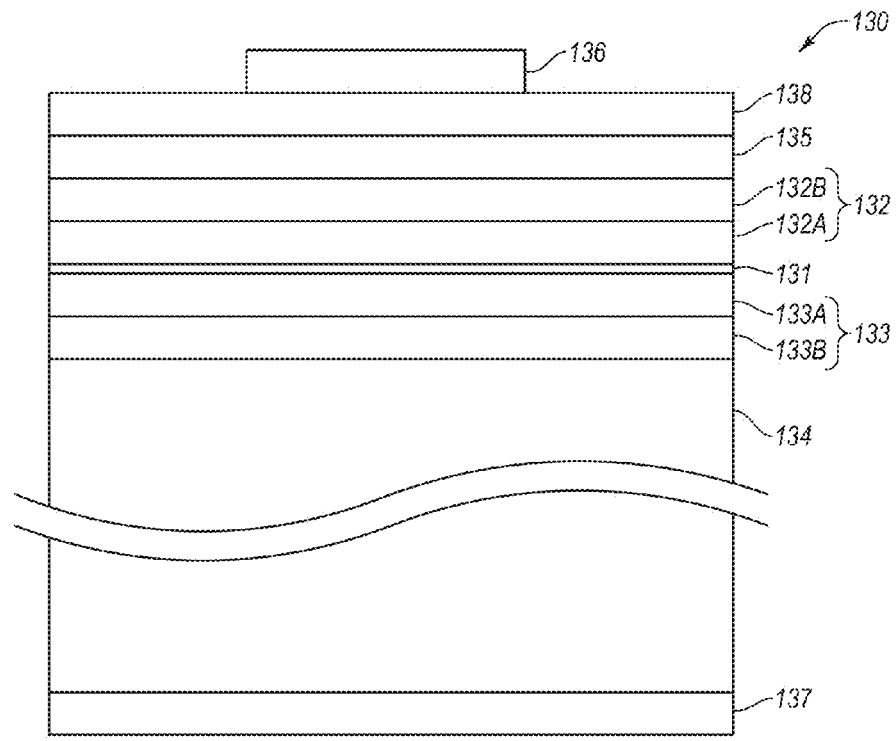
FIG. 1D is a cross-section of an example DBR laser through a gain section of the DBR laser.

FIG. 1D is a cross-section of an example DBR laser 130 through a gain section of the DBR laser, arranged in accordance with at least some embodiments described herein. Each of the DBR lasers 100, 110, 120 of FIGS. 1A-1C may have an identical or similar configuration as the DBR laser 130 of FIG. 1D.

In general, the DBR laser 130 includes an active region 131. The active region 131 may be formed from a quaternary material, such as indium-gallium-arsenide-phosphide (InGaAsP) or indium-gallium-alluminum-arsenide (InGaAlAs). Alternately or additionally, the active region 131 may include an MQW region, such as an InGaAsP or InGaAlAs MQW strained layer, having 5-12 quantum wells (QWs) and corresponding barriers. For instance, the MQW region may include 8 QWs and 7 barriers.

The DBR laser 130 further includes an upper separate confinement heterostructure (SCH) 132 and a lower SCH 133. In the illustrated embodiment, the upper SCH 132 includes a lower layer 132A of a first material, and an upper layer 132B of a second material. The lower SCH 132 includes an upper layer 133A of the first material, and a lower layer 133B of the second material. Each of the first and second materials may include a quaternary material such as InGaAsP or InGaAlAs, or the like, or other suitable material(s). Although each SCH 132 and 133 is illustrated as being made up of two layers 132A and 132B or 133A and 133B, more generally, each SCH 132 and 133 may include one or more layers.

In an example embodiment, the lower layer 132A of the upper SCH 132 may be undoped, while the upper layer 132B of the upper SCH 132 is p-doped with a doping density in a range from about $2 \times 10^{17}$ cm$^{-3}$ to about $5 \times 10^{17}$ cm$^{-3}$. Analogously, the upper layer 133A of the lower SCH 133 may be undoped, while the lower layer 133B may be n-doped with a doping density of about $2 \times 10^{17}$ cm$^{-3}$ to about $5 \times 10^{17}$ cm$^{-3}$.

Each of the upper and lower SCHs 132, 133 may have a thickness of at least 60 nanometers (nm). Alternately or additionally, each of the upper and lower SCHs 132, 133 may have a thickness less than 120 nm.

The DBR laser 130 further includes a substrate 134 on which the layers 131-133 are formed. The substrate 134 may be made of the second material. Alternately or additionally, the substrate 134 may be n-doped with a doping density in a range from about $1 \times 10^{18}$ cm$^{-3}$ to about $3 \times 10^{18}$ cm$^{-3}$.

The DBR laser 130 may additionally include a cladding layer 135, a narrow bandgap layer 138, an upper or gain electrode 136, and a lower electrode 137. The cladding layer 135 may include p-doped indium-phosphide (InP). The narrow bandgap layer 138 may include, for instance, a thin layer of highly p-doped indium-gallium-arsenide (InGaAs) to improve ohmic contact.

Figure 1E:
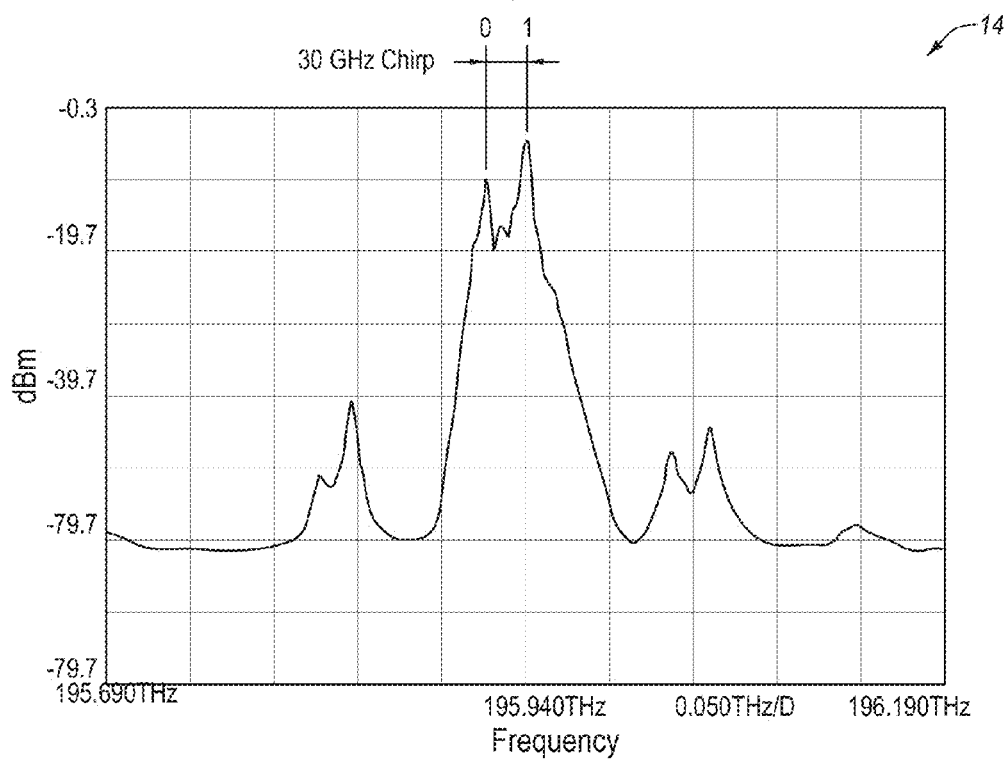
FIG. 1E illustrates an example frequency spectrum 140 of a directly modulated DBR laser.

FIG. 1E illustrates an example frequency spectrum 140 of a directly modulated DBR laser, arranged in accordance with at least some embodiments described herein. For instance, any of the DBR lasers 100, 110, 120, 130 of FIGS. 1A-1D may have a frequency spectrum similar to the frequency spectrum 140 of FIG. 1E when directly modulated. In directly modulated lasers (DMLs) that are amplitude modulated, frequency modulation also occurs in a manner that generally follows the amplitude modulation profile, such that 1 bits are typically blue-shifted relative to 0 bits (or vice versa when modulated by data-bar), as illustrated in FIG. 1E.

Such frequency excursion between the 1 bits and 0 bits is often referred to as chirp. The frequency spectrum 140 of FIG. 4 has about 30 gigahertz (GHz) of chirp. More generally, the chirp may be in a range from about 0.1 GHz/mApp to about 0.5 GHz/mApp. The frequency spectrum 140 of FIG. 4 including 30 GHz of chirp was generated for a DBR laser directly modulated by a 60 mApp modulation signal.

FIG. 2A illustrates a rate equations model 200 for a laser, arranged in accordance with at least some embodiments described herein. The rate equations model 200 may be used for the directly modulated DBR lasers described herein, for instance. The rate equations model 200 includes a carriers rate equation 202, a photons rate equation 204, and a phase rate equation 206. In equations 202, 204, 206:
  N is carriers including electrons and holes in the active region;

$$\frac{\partial N}{\partial t}$$

is the carrier density;
  I is total modulation current, including the sum of direct current (DC) bias and modulation swing;
  g is gain and is a function of N;
  ε is gain compression factor and is a constant material parameter;
  S is photons in the active region;

$$\frac{\partial S}{\partial t}$$

is the change in S over time;
  $\tau_p$ is the photon lifetime;
  v is frequency of the generated optical signal;

$$\frac{\partial \varphi}{\partial t}$$

is the change in phase of photons over time, which is equal to frequency v;
  $\Gamma_{well}$ is the optical confinement factor for the MQW region;
  α is linewidth enhancement factor and is a constant material parameter;
  $\Gamma_{SCH}$ is the optical confinement factor for the SCH;
  $dn/dN_{SCH}$ is the change in diffractive index due to change in carrier density in the SCH, also referred to as the differential diffractive index change due to carrier change in the SCH; and
  $N_{SCH}$ is carriers including electrons and holes in the SCH.

In equation 206, gain g is indicated to be a function of N. Similarly, gain g in equations 202 and 204 should be a function of N.

In conventional rate equations models, the photon lifetime $\tau_p$ is considered to be constant for simplicity. According to embodiments described herein, however, the photon lifetime $\tau_p$ is considered to change dynamically. In particular, the photon lifetime $\tau_p$ is a measure of photon loss, including carrier-created loss such as plasma effect of loss or intervalance band absorption (IVBA), or some other absorption mechanism related to the injection carrier (e.g., electrons). The carrier-created loss dynamically changes when the laser is directly modulated because the injection carrier is directly modulated. Additionally, in DBR lasers, the reflectance (e.g., mirror loss) of the DBR filter is frequency-dependent. Thus, the reflectance or mirror loss of the DBR filter will vary as a function of the frequency of the generated photons, which is generally higher for 1 bits than for 0 bits for a DML, as described with respect to FIG. 1E.

The rate equations model 200 additionally takes into account carrier transport effect. In general, the carrier transport effect refers to the effect on optical output as a result of the delays involved in transporting carriers through various layers of a DML. FIG. 2B shows a model 210 of a theoretical simulation to investigate the carrier transport effect, arranged in accordance with at least some embodiments described herein. Although a brief description of the model 210 will be provided herein, more detailed modeling can be found in Matsui et al., Novel Design Scheme for High-Speed MQW Lasers with Enhanced Differential Gain and Reduced Carrier Transport Effect, IEEE Journal of Quantum Electronics, Vol. 34, No. 12, December 1998, which publication is herein incorporated by reference.

The model 210 of FIG. 2B includes a cladding layer, an SCH, two QWs, and a barrier that may all be included in a DML, such as a directly modulated DBR laser as generally described above. When directly modulated, carrier is injected through the cladding layer, goes through the SCH layer, is captured by the QW, may escape the QW and/or may tunnel through the barrier to another QW before a transition occurs. Each one of the foregoing steps takes some finite time and creates a delay which may damp ringing or relaxation oscillation. Moreover, in FIG. 2B:
  $\tau_{dif}$ is SCH diffusion lifetime;
  $\tau_{drift}$ is SCH drift lifetime;
  $\tau_{cap}$ is QW capture lifetime;
  $\tau_{esc}$ is QW escape lifetime; and
  $\tau_{tun}$ is barrier tunneling lifetime;
In some embodiments, $\tau_{dif}$ and $\tau_{drift}$ are on the order of a few ps so they do not significantly reduce the speed of the laser.

FIG. 2B further illustrates the relationship between 2D carriers in the wells and 3D carriers in extended state in barriers in equation 212. The denominator 3D/2D in equation 212 may be determined by the Boltzmann distribution.

In some embodiments, the carrier transport effect is accounted for the in the rate equations model 200 of FIG. 2A by, in general, determining carrier density in the QWs according to the model 210 of FIG. 2B to characterize gain g, and then solving the equations 202, 204, 206 of FIG. 2A. In more detail, in FIG. 2A, gain g is a function of N. In FIG. 2B, 2D represents the carriers confined in two dimensions in each of the QWs. Carriers N are injected from the electrode through the cladding layer, transport through the SCH with time constants $\tau_{dif}$ and $\tau_{drift}$ and reach the barrier as the 3D state before being captured in the QWs. After reaching the QWs, the carriers N may contribute to gain, although some carriers N may escape by tunneling or thermionic emission. Accordingly, the model of FIG. 2B can be solved to find carrier density in the well, to characterize gain g, and to thereby solve equations 202, 204, 206 of FIG. 2A.

Figure 3A:
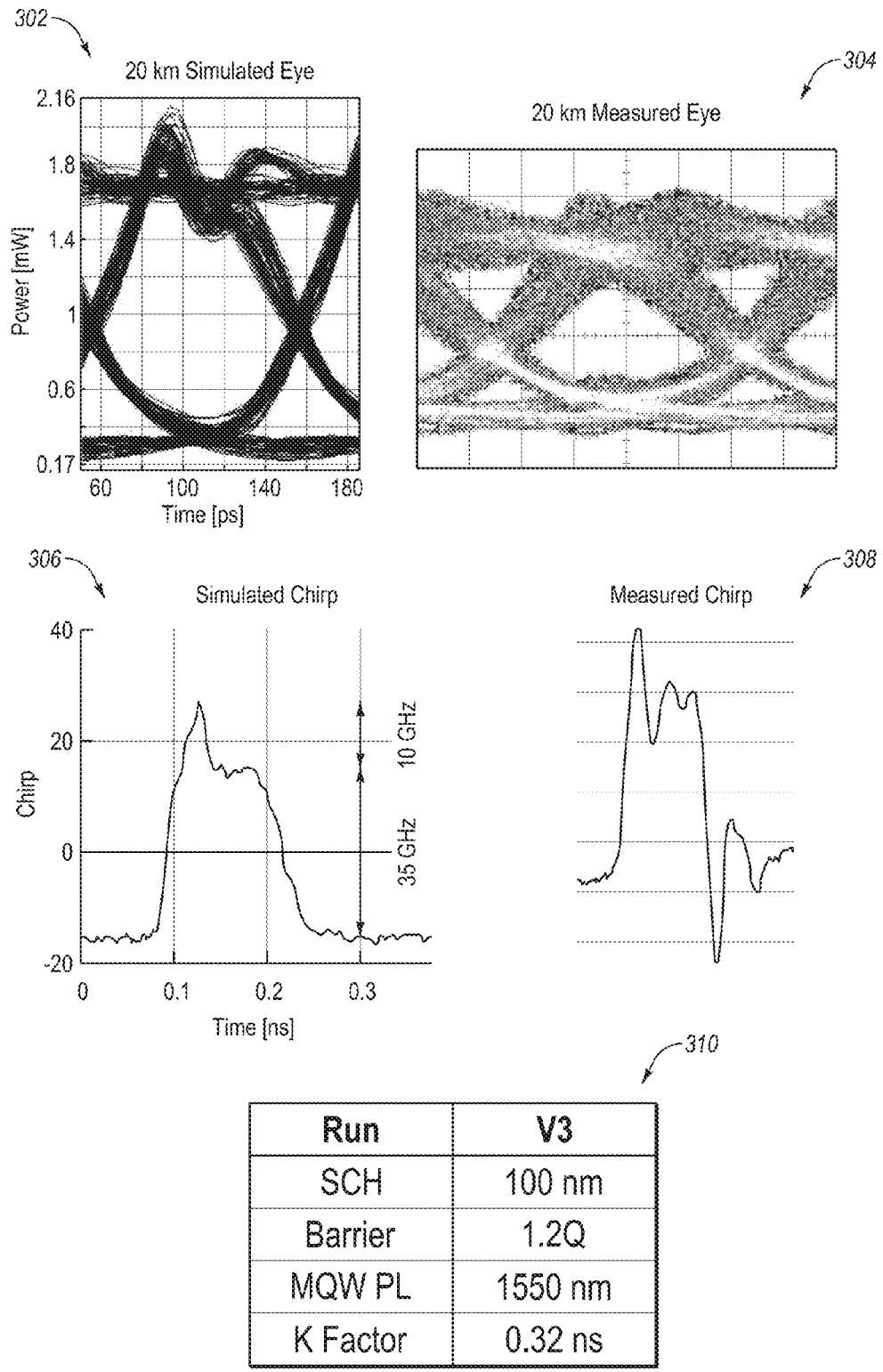
FIG. 3A illustrates eye diagrams and FM profiles associated with a first example directly modulated DBR laser.

FIG. 3A illustrates eye diagrams 302, 304 and FM profiles 306, 308 associated with an example directly modulated DBR laser V3, arranged in accordance with at least some embodiments described herein. The DBR laser V3 is a 10 G directly modulated front DBR laser such as the DBR laser 100 of FIG. 1A. FIG. 3A further illustrates a table 310 including various parameters of the DBR laser V3. In particular, according to the table 310, the DBR laser V3 has an SCH thickness of 100 nm, a barrier of 1.2 Q, a MQW PL of 1550 nm, and a K factor of 0.32 nanoseconds (ns).

The eye diagram 302 is a 20 kilometer (km) simulated optical eye diagram, while the eye diagram 304 is a 20 km measured optical eye diagram. As shown, the eye diagram 304 is substantially open even after transmission through 20 km of dispersive fiber.

The FM profile 306 is a simulated FM profile for the DBR laser V3 based on the rate equations model 200 of FIG. 2A, while the FM profile 308 is a measured FM profile for the DBR laser V3. Both FM profiles 306, 308 include a 0 1 0 bit sequence. As illustrated, both FM profiles 306, 308 have about 35 GHz of adiabatic chirp and 10 GHz of transient chirp. Thus, a ratio of transient chirp to adiabatic chirp of 2:7 (or about 0.286) produces a 20 km eye that is substantially open, as shown in the eye diagram 304. More generally, 10 G and higher directly modulated DBR lasers as described herein may have a ratio of transient chirp to adiabatic chirp in a range from 1:3 to 1:4 (or a range from about 0.33 to 0.25), which may be suitable to produce a 20 km eye that is substantially open.

Figure 3B:
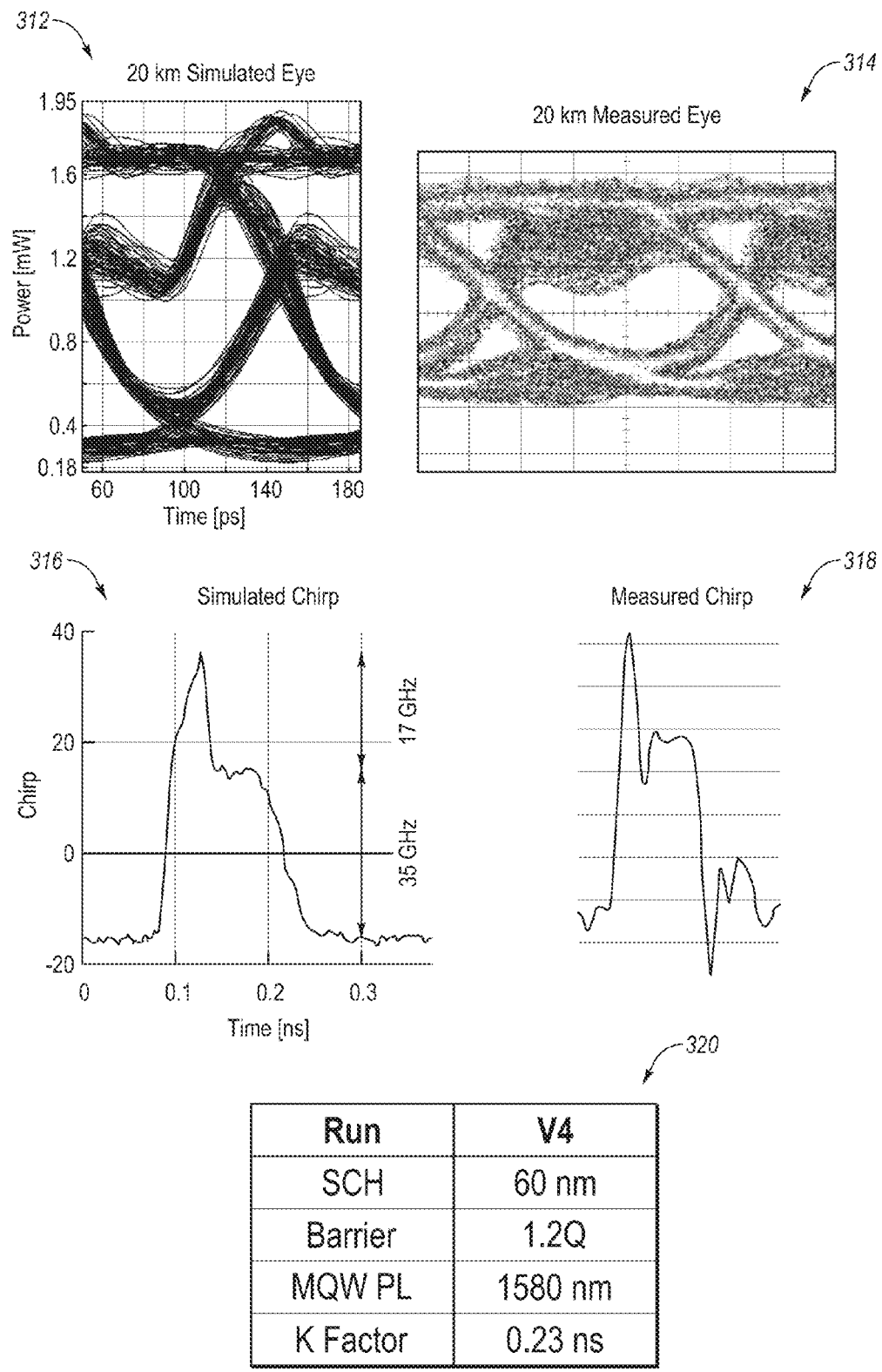
FIG. 3B illustrates eye diagrams and FM profiles associated with a second example directly modulated DBR laser.

FIG. 3B illustrates eye diagrams 312, 314 and FM profiles 316, 318 associated with an example directly modulated DBR laser V4, arranged in accordance with at least some embodiments described herein. The DBR laser V4 is a 10 G directly modulated front DBR laser such as the DBR laser 100 of FIG. 1A. FIG. 3B further illustrates a table 320 including various parameters of the DBR laser V4. In particular, according to the table 320, the DBR laser V4 has an SCH thickness of 60 nm, a barrier of 1.2 Q, a MQW PL of 1580 nm, and a K factor of 0.23 ns.

The FM profile 316 is a simulated FM profile for the DBR laser V4 based on the rate equations model 200 of FIG. 2A, while the FM profile 318 is a measured FM profile for the DBR laser V4. Both FM profiles 316, 318 include a 0 1 0 bit sequence. As illustrated, both FM profiles 316, 318 have about 35 GHz of adiabatic chirp and 17 GHz of transient chirp. In this case, the ratio of transient chirp to adiabatic chirp is too high, e.g., about 1:2 and the K factor is too low, producing a 20 km eye that is substantially closed, as shown in the simulated and measured eye diagrams 312, 314.

Figure 3C:
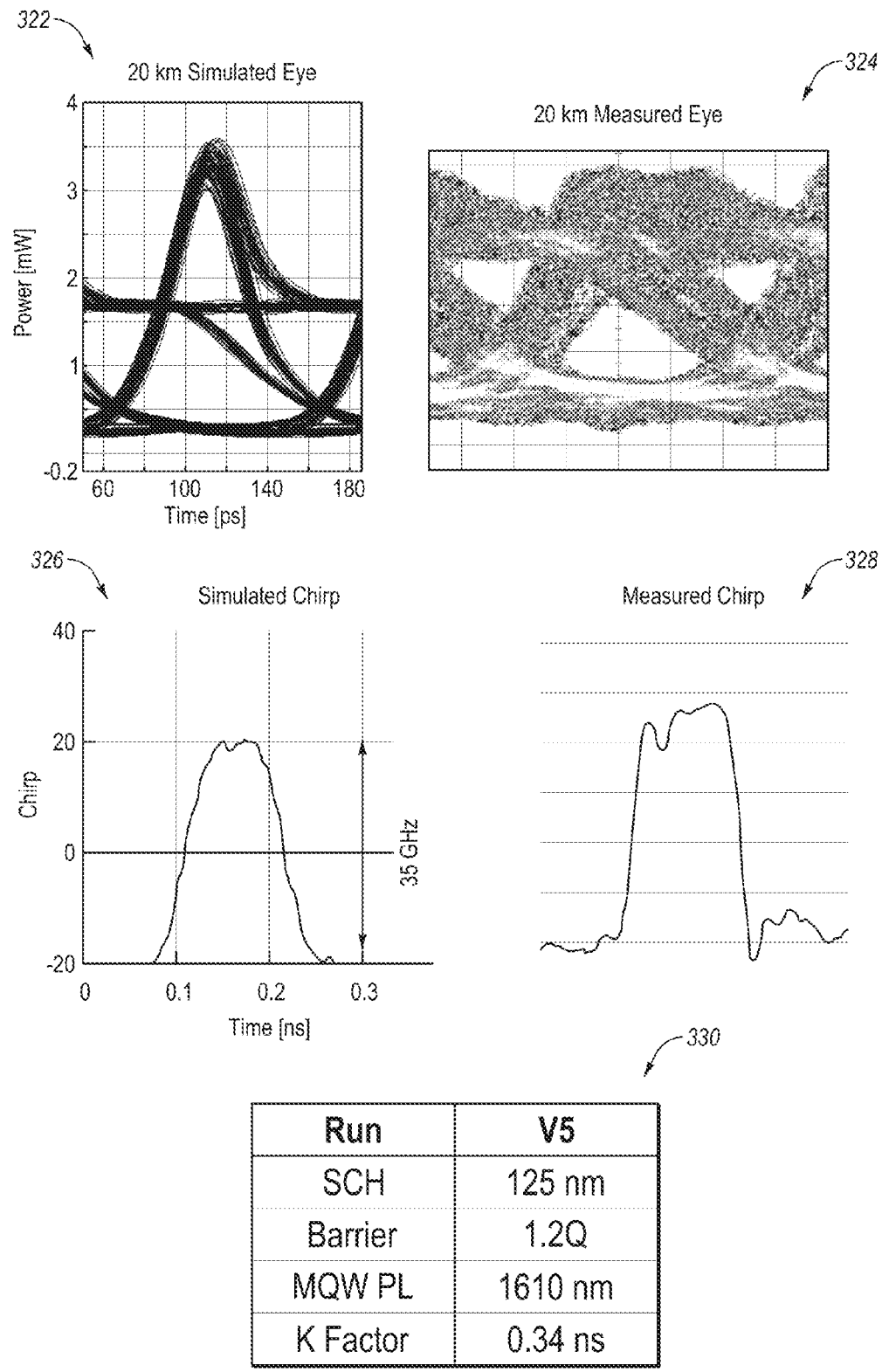
FIG. 3C illustrates eye diagrams and FM profiles associated with a third example directly modulated DBR laser.

FIG. 3C illustrates eye diagrams 322, 324 and FM profiles 326, 328 associated with an example directly modulated DBR laser V5, arranged in accordance with at least some embodiments described herein. The DBR laser V5 is a 10 G directly modulated front DBR laser such as the DBR laser 100 of FIG. 1A. FIG. 3C further illustrates a table 330 including various parameters of the DBR laser V5. In particular, according to the table 330, the DBR laser V5 has an SCH thickness of 125 nm, a barrier of 1.2 Q, a MQW PL of 1610 nm, and a K factor of 0.34 ns.

The FM profile 326 is a simulated FM profile for the DBR laser V5 based on the rate equations model 200 of FIG. 2A, while the FM profile 328 is a measured FM profile for the DBR laser V5. Both FM profiles 326, 328 include a 0 1 0 bit sequence. As illustrated, both FM profiles 326, 328 have about 35 GHz of adiabatic chirp and effectively no transient chirp. In this case, the ratio of transient chirp to adiabatic chirp is effectively non-existent and the K factor is too high, producing a 20 km eye that is substantially closed, as shown in the simulated and measured eye diagrams 322, 324. The 20 km eye is closed due to a low-pass filter effect caused by the thicker SCH compared to that of the DBR laser V3. As will be described in greater detail below, however, a high-pass electrical filter may be used to filter the modulation signal applied to the DBR laser V5 to effectively cancel out the low-pass filter effect.

Figure 4A:
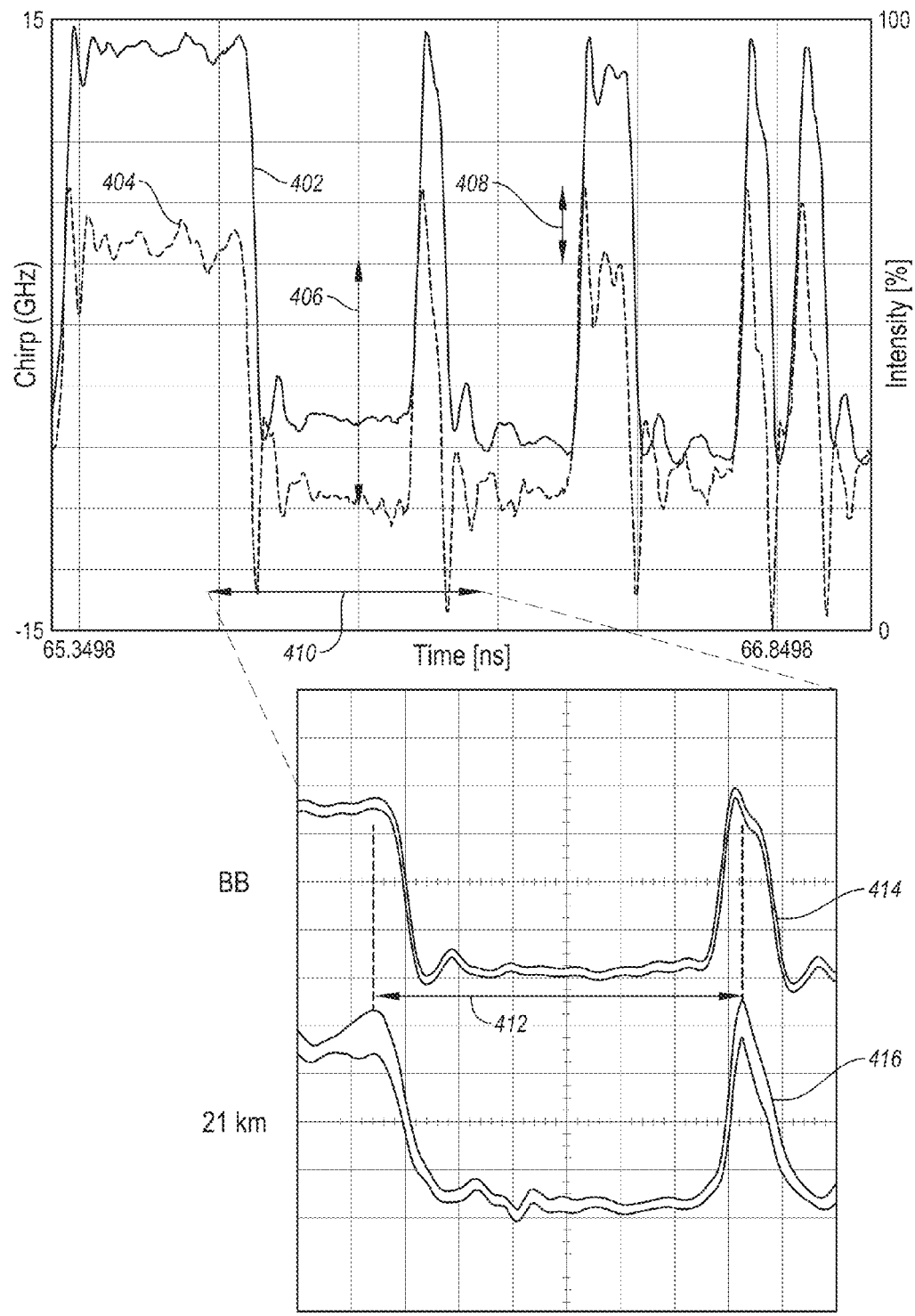
FIG. 4A illustrates simulated AM and FM profiles for the DBR laser of FIG. 3A for a 10 G binary bit sequence.

FIG. 4A illustrates simulated AM and FM profiles 402, 404 for the DBR laser V3 of FIG. 3A for a 10 G binary bit sequence. As illustrated in FIG. 4A, the FM profile 404 generally follows the AM profile 402. FIG. 4A additionally includes arrows 406, 408 identifying, respectively, adiabatic chirp and transient chirp.

The FM profile 404 generally remains flat, not counting the transient chirp, such that all the 1 bits have substantially the same frequency and all the 0 bits have substantially the same frequency that is lower than the frequency of the 1 bits, even for 1 bits in 0-rich regions and/or 0 bits in 1-rich regions of the binary bit sequence, thereby reducing dispersion as compared to FM profiles with FM droop. By way of illustration, consider 0-rich region 410 preceded by a 1 bit and terminated by a 1 bit. The relative timing between the preceding 1 bit and the terminating 1 bit is depicted in FIG. 4A at 412 for a corresponding measured back-to-back (BB) AM profile 414.

Because the FM profile 404 generally remains flat, there is no timing skew between the preceding and terminating 1 bits after transmission through 21 km of fiber, as illustrated by a corresponding measured 21 km AM profile 416. In more detail, the preceding 1 bit and the terminating 1 bit have the same frequency and thus travel through 21 km of fiber with the same speed, thereby maintaining the same relative timing 412.

Figure 4B:
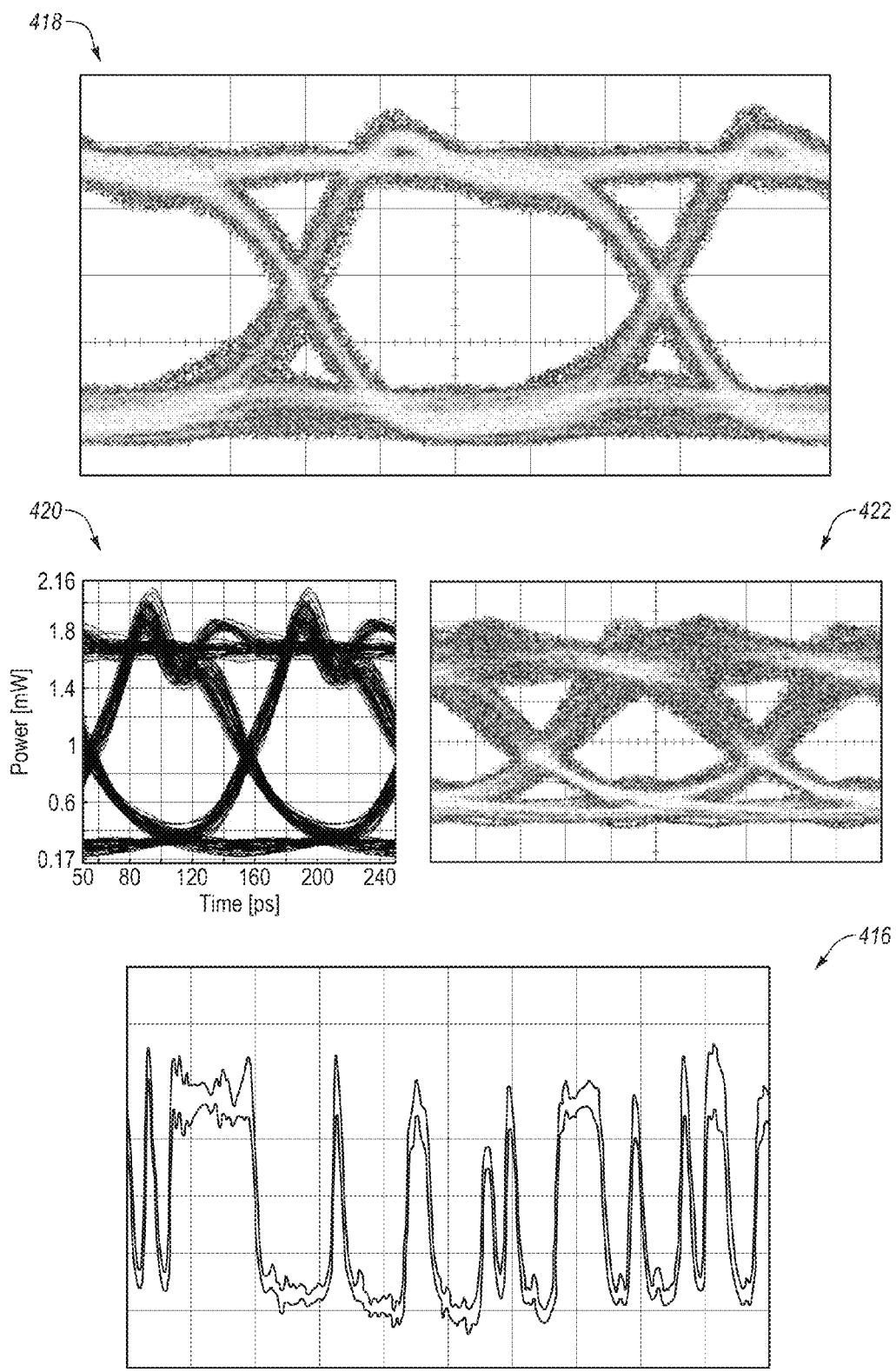
FIG. 4B illustrates eye diagrams and a measured 21 km AM profile for the DBR laser of FIG. 3A.

FIG. 4B illustrates eye diagrams 418, 420, 422 and the measured 21 km AM profile 416 in more detail for the DBR laser V3 of FIG. 3A. The eye diagram 418 is a measured BB eye diagram, the eye diagram 420 is a simulated 20 km eye diagram, and the eye diagram 422 is a measured 21 km eye diagram. It can be seen in FIG. 4B that both the BB eye and the 21 km eye for the DBR laser V3 are substantially open.

Figure 5A:
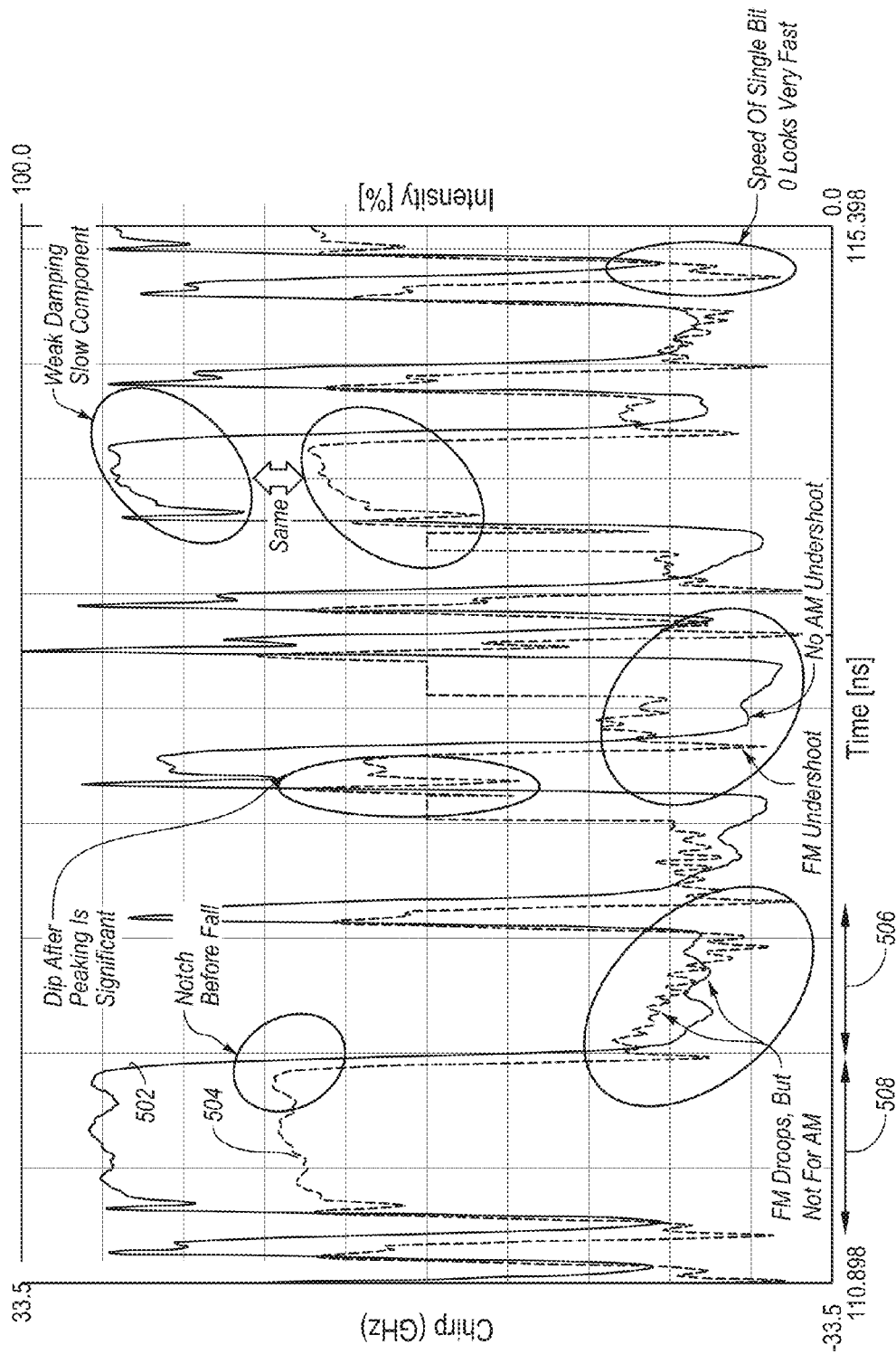
FIG. 5A illustrates simulated AM and FM profiles for the DBR laser of FIG. 3C for the same 10 G binary bit sequence as FIG. 4A.

FIG. 5A illustrates simulated AM and FM profiles 502, 504 for the DBR laser V5 of FIG. 3C for the same 10 G binary bit sequence as FIG. 4A. FIG. 5A additionally identifies various features in the AM and/or FM profiles 502, 504. The features include a notch in the FM profile 504 before 1-to-0 transitions, FM droop in 0 rich areas without corresponding AM droop, a dip after peaking in the FM profile 504 at 0-to-1 transitions, FM undershoot at 1-to-0 transitions without corresponding AM undershoot, weak damping in both the AM and FM profiles 502, 504 in 1-rich regions, and single 0 bits that appear very fast.

FM droop may generally refer to a slow change in the FM profile 504, e.g., on the order of 1 ns, and is also referred to as the slow component mentioned along with the weak damping feature identified in FIG. 5A. This slow component is not predicted by standard laser rate equations models in which the photon lifetime $\tau_p$ is considered constant and the carrier transport effect is not accounted for. By accounting for a dynamic photon lifetime and the carrier transport effect in the rate equations model 200 of FIG. 2A as already described above, however, this slow component is predicted for the DBR laser V5 as a result of the SCH thickness being too great.

One issue with the slow component or FM droop is that it may skew timing. In more detail, consider 0-rich region 506 preceded by a 1 bit and terminated by a 1 bit. Because the preceding 1 bit for the 0-rich region 506 terminates a 1-rich region 508, the slow component causes the frequency of the preceding 1 bit for the 0-rich region 506 to be relatively high as the frequency of the 1 bits in the 1-rich region 508 is generally increasing. Within the 0-rich region 506, however, the slow component causes the frequency of the 0 bits in the 0-rich region to decrease significantly, or droop, and the resulting frequency of the terminating 1 bit for the 0-rich region 506 is therefore significantly lower than the frequency of the preceding 1 bit for the 0-rich region 506. The frequency difference between the preceding and terminating 1 bits for the 0-rich region 506 causes timing skew after transmission through 21 km of dispersive fiber, as described in more detail with respect to FIG. 5B.

Figure 5B:
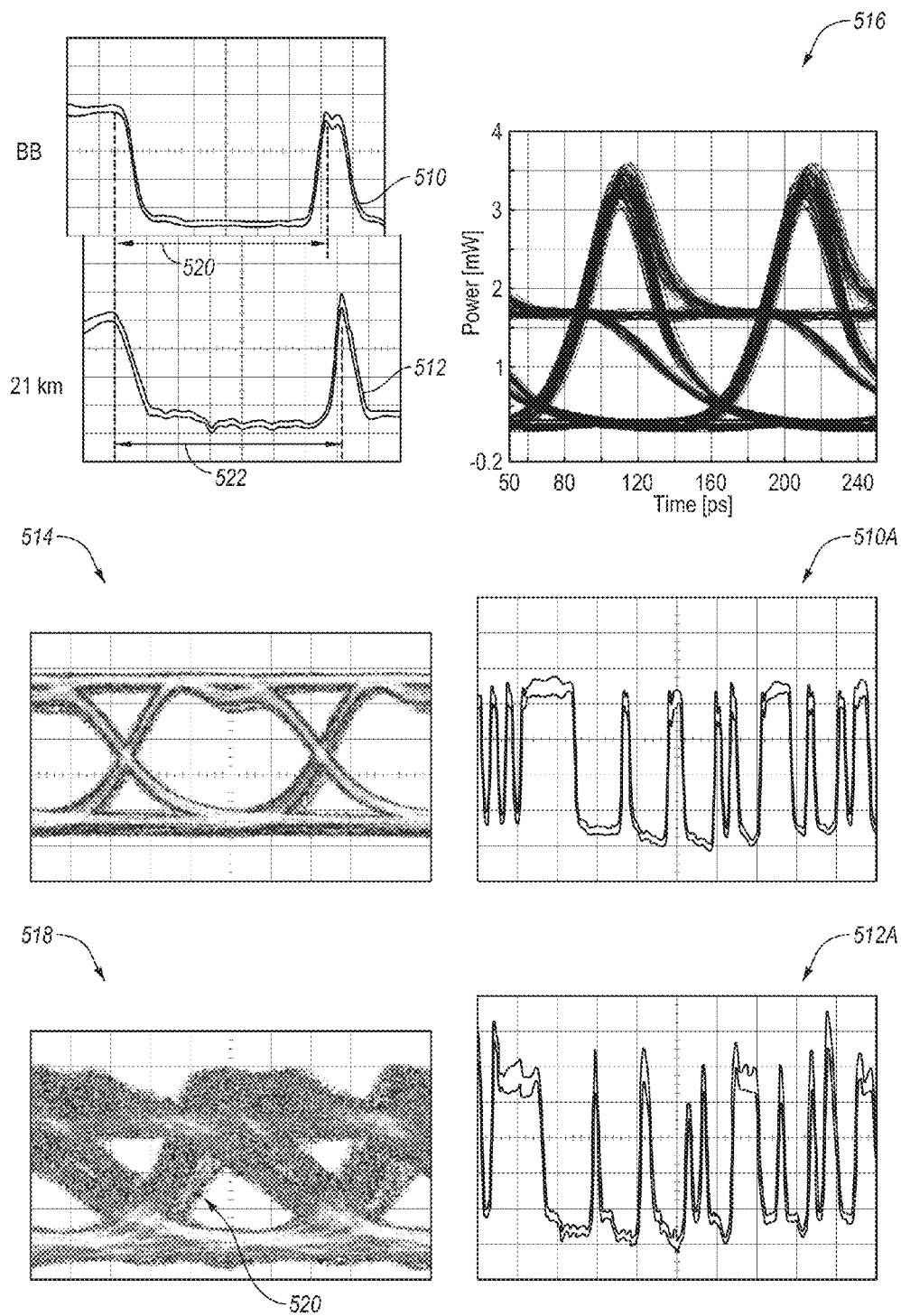
FIG. 5B illustrates a measured back-to-back (BB) AM profile, a measured 21 km AM profile, and eye diagrams for the DBR laser of FIG. 3C.

FIG. 5B illustrates a measured BB AM profile 510, a measured 21 km AM profile 512, eye diagrams 514, 516, 518, and more detailed versions 510A, 512A of the measured BB and 21 km AM profiles 510, 512 for the DBR laser V5 of FIG. 3C. With combined reference to FIGS. 5A-5B, the relative timing between the preceding 1 bit and the terminating 1 bit for the 0-rich region 506 is depicted in FIG. 5B at 520 for the measured BB AM profile 510. Because the terminating 1 bit has a significantly lower frequency than the preceding 1 bit for the 0-rich region 506, the terminating 1 bit will travel slower through 21 km of dispersive fiber than the preceding 1 bit. In the present example, the terminating 1 bit traveled 40 picoseconds (ps) slower through the same 21 km length of fiber as the preceding 1 bit. The longer traveling time is referred to as timing skew. More generally, however, a relative timing 522 between the preceding 1 bit and the terminating 1 bit in the measured 21 km AM profile 512 is greater than the relative timing 520 between the preceding 1 bit and the terminating 1 bit in the measured BB AM profile 510 due to the lower frequency of the terminating 1 bit compared to the preceding 1 bit.

The eye diagram 514 is a measured BB eye diagram, the eye diagram 516 is a simulated 20 km eye diagram, and the eye diagram 518 is a measured 21 km eye diagram. The timing skew as already described above closes the eye diagram 518 in an area generally denoted at 520 in the eye diagram 518.

Figure 5C:
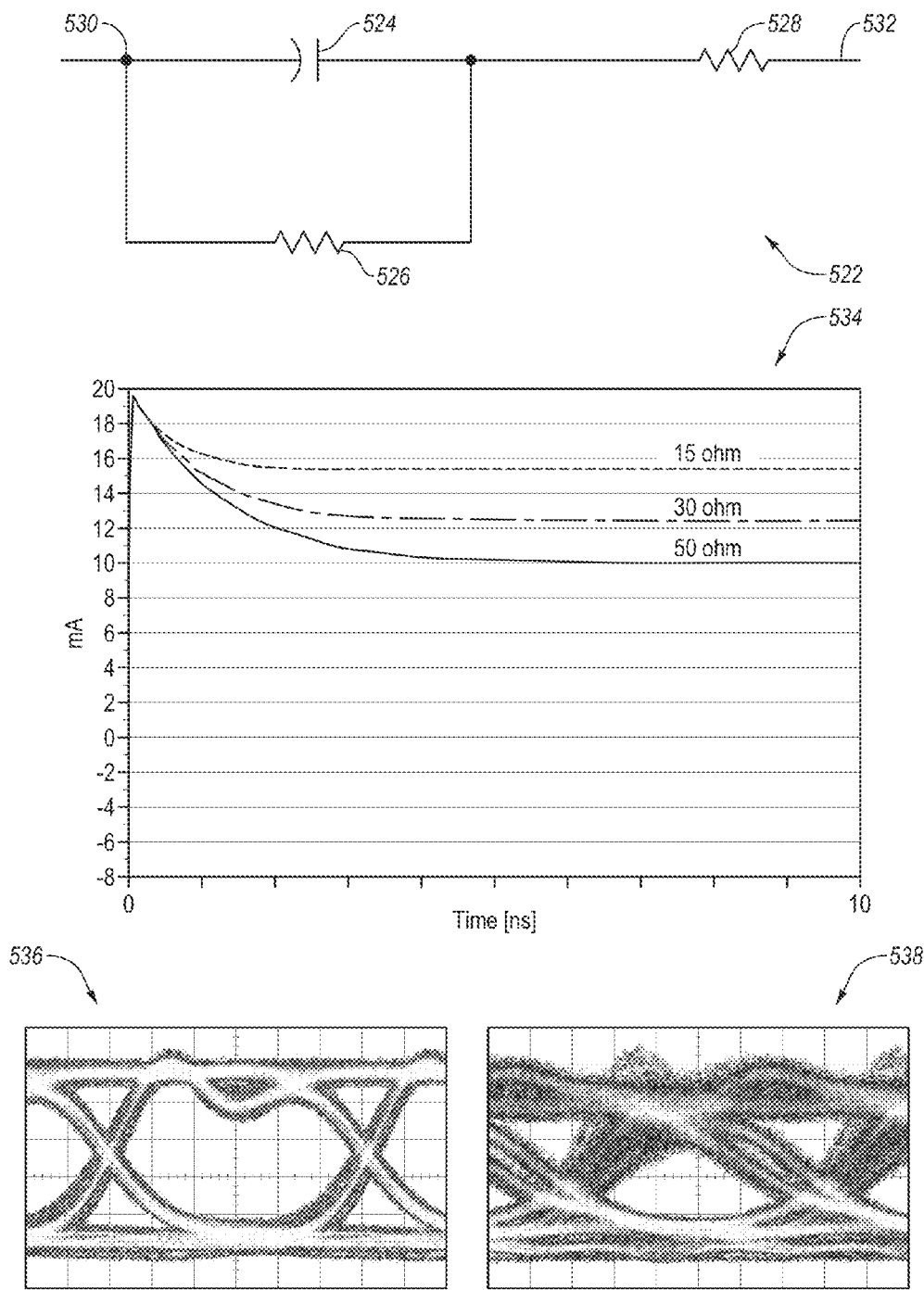
FIG. 5C illustrates an example electrical high-pass filter that may be implemented to equalize a low frequency issue, or slow component, in the DBR laser of FIG. 3C.

FIG. 5C illustrates an example electrical high-pass filter (HPF) 522 that may be implemented to equalize the low frequency issue, or slow component, in the DBR laser V5 of FIG. 3C caused by the thickness of the SCH, arranged in accordance with at least some embodiments described herein. For example, the HPF 522 may be provided in an optical transmitter including a direct modulation source and the DBR laser V5 or a similar DBR laser. The HPF 522 may be coupled between the direct modulation source and the DBR laser.

In the illustrated embodiment, the HPF 522 is an RC circuit and includes a capacitor 524, a first resistor 526, and a second resistor 528. The capacitor 524 is coupled in parallel with the first resistor 526. The parallel-coupled capacitor 524 and first resistor 526 are coupled in series with the second resistor 528. The HPF 522 further includes an input node 530 configured to be coupled to the direct modulation source and an output node 532 configured to be coupled to the DBR laser. In an example embodiment, the capacitor 524 has a capacitance of about 50 picofarads (pF), the first resistor 526 has a resistance of about 15 Ohms (Ω), and the second resistor 528 has a resistance of about 45 Ω.

A HPF with a similar time constant as the HPF 522 can be designed using a parallel shunt inductor with an additional resistor in series with the inductor before being connected to ground.

FIG. 5C additionally illustrates various current responses 534 of the HPF 522 over time for three different resistance values for the first resistor 526. With combined reference to FIGS. 5A and 5C, and as already explained above, in 0-rich regions such as the 0-rich region 506, the FM profile 504 or the chirp gradually droops. As best seen with respect to the current responses 534, the HPF 522 essentially does the opposite by injecting current gradually over 0-rich regions, which may ultimately substantially cancel out or equalize the FM droop. Accordingly, the HPF 522 may have a time constant on the order of about 1 ns, or more generally a time constant about equal to the time constant of the slow component.

FIG. 5C additionally illustrates eye diagrams 536 and 538. The eye diagram 536 is a measured BB eye diagram for the optical transmitter including the DBR laser V5 and the HPF 522. The eye diagram 538 is a measured 21 km eye diagram for the optical transmitter including the DBR laser V5 and the HPF 522. As can be seen by comparing the eye diagram 538 of FIG. 5C to the eye diagram 518 of FIG. 5B, the HPF 522 equalizes the low frequency issue or slow component and opens up the measured 21 km eye diagram.

FIGS. 6A-6G illustrate simulations 600A-600G (collectively "simulations 600") with various DBR parameters, arranged in accordance with at least some embodiments described herein. Some of the simulations adjust the parameters consistent with the rate equations model 200 and/or the model 210 of FIGS. 2A-2B.

Each of FIGS. 6A-6G includes two graphs, including a first graph with various time series simulations of a 1 0 1 bit sequence and DBR laser bias and modulation values, and a second graph with various distribution simulations within certain layers of the DBR laser. The time series simulations include photon density (hereinafter "Photon"), chirp attributable to the MQW region (hereinafter "ChirpMQW"), chirp attributable to the plasma effect (hereinafter "ChirpPlasma"), and total chirp (hereinafter "TotalChirp") as the sum of ChirpMQW and ChirpPlasma. In some embodiments, ChirpMQW may be similar to gain, and ChirpPlasma may relate to overflow carriers. The distribution simulations include electron density in the wells (hereinafter "Electron well"), hole density in the wells (hereinafter "Hole well"), electron density in the barriers (hereinafter "Electron barrier"), hole density in the barriers (hereinafter "Hole barrier"), and electric field (hereinafter "Electric field").

Figure 6A:
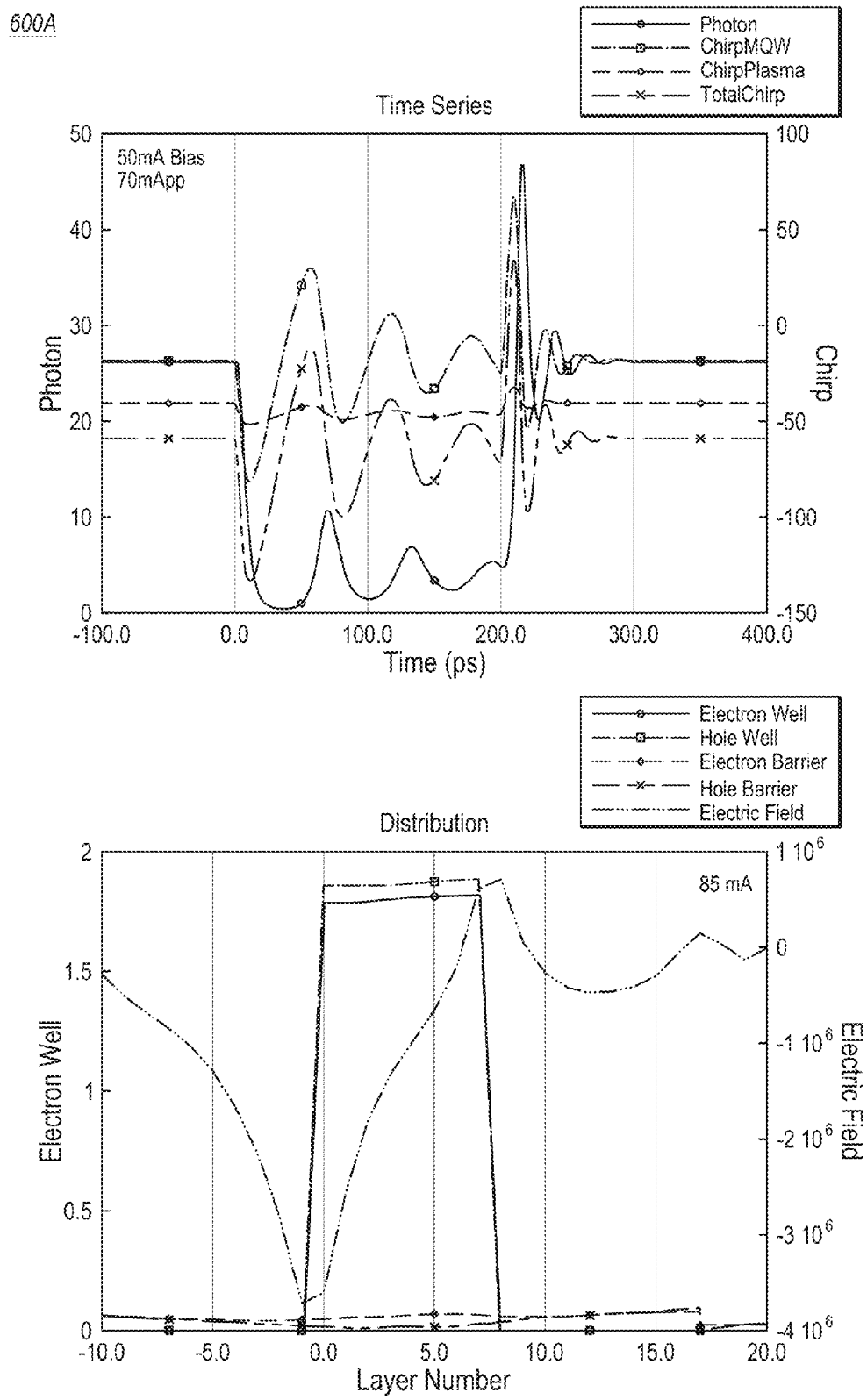
FIGS. 6A-6G illustrate simulations with various DBR parameters.

The parameters for the simulation 600A of FIG. 6A are provided in Table A below.

TABLE A

| Parameter: | Value: |
| --- | --- |
| electron capture time | 0.3 ps |
| hole capture time | 0.3 ps |
| hole overflow → hole escape time 300 ps | 0.1% |
| electron mobility | 2500 cm$^2$/V/s |
| hole mobility | 2500 cm$^2$/V/s |
| electron tunneling time | 0.134 ps |
| hole tunneling time | 0.134 ps |

The simulation 600A of FIG. 6A is a relatively simple case where photon lifetime is considered to be constant. As can be seen from the time series simulations, damping is relatively small and there is substantial ringing. As can be seen from the distribution simulations, there is a relatively uniform hole distribution.

Figure 6B:
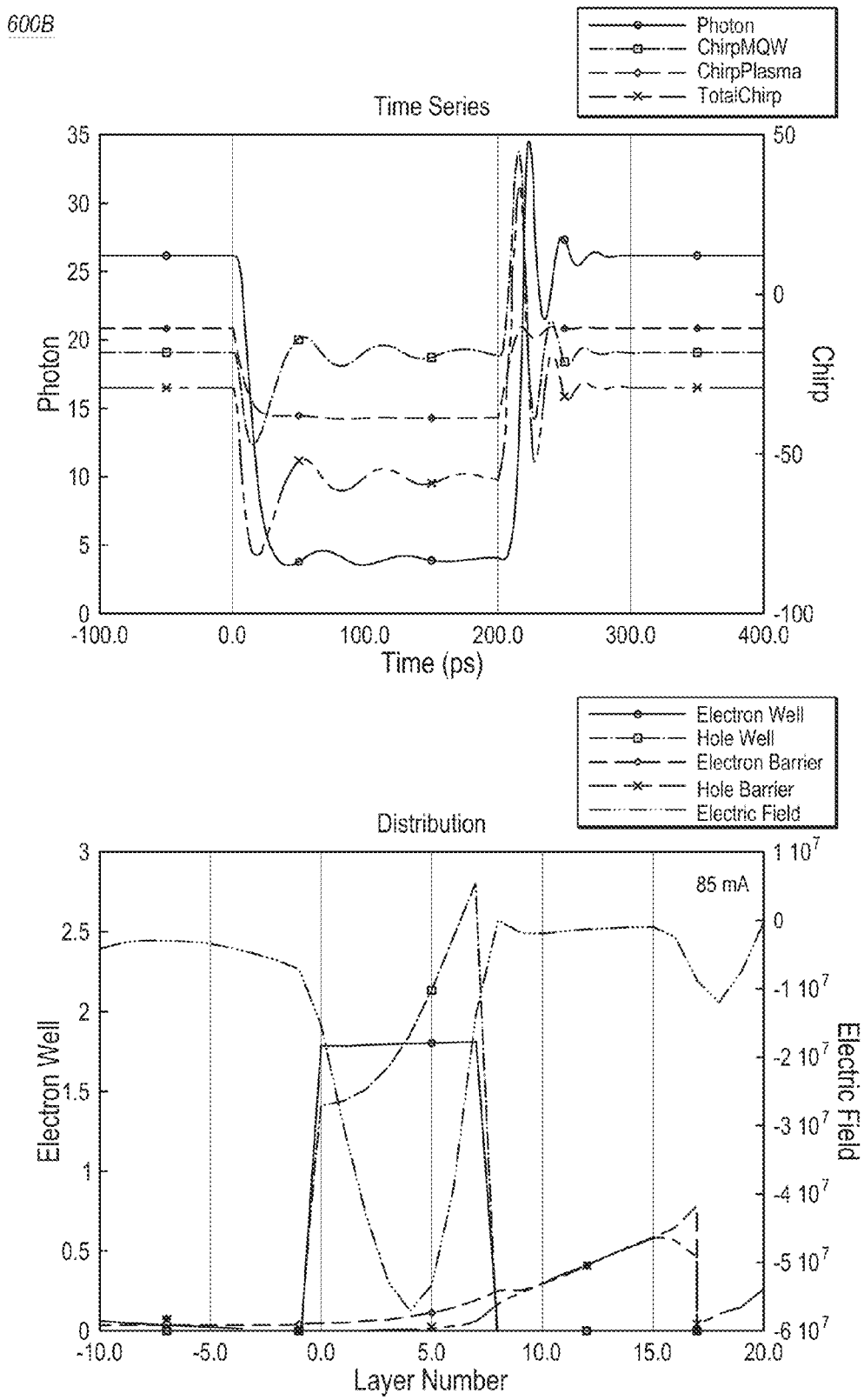

The parameters for the simulation 600B of FIG. 6B are provided in Table B below.

TABLE B

| Parameter: | Value: |
|---|---|
| electron capture time | 1.0 ps |
| hole capture time | 0.3 ps |
| hole overflow → hole escape time 300 ps | 0.1% |
| electron mobility | 2500 cm^2/V/s |
| hole mobility | 180 cm^2/V/s |
| electron tunneling time | 0.134 ps |
| hole tunneling time | 4.0 ps |

Compared to the simulation 600A of FIG. 6A, the carrier transport effect is considered in the simulation 600B of FIG. 6B. For instance, the electron capture time is increased from 0.3 ps to 1.0 ps, the hole mobility is decreased from 2500 cm$^2$/V/s to 180 cm$^2$/V/s, and the hole tunneling time is increased from 0.134 ps to 4.0 ps. The foregoing modified parameters correspond to an SCH thickness of 100 nm. The carrier transport effect damps the ringing in the time series simulations of FIG. 6B.

The middle of the distribution simulations where the Electron well density and the Hole well density is greatest corresponds to the position of a QW. As illustrated, holes are generally coming from the right and electrons are coming from the left and they combine in the QW. Because the holes are transported relatively slowly through the p-side SCH to the right of the QW, the holes accumulate on the right of the QW. In the simulation 600A of FIG. 6A, carrier is injected directly into the QW so the carrier is very fast, resulting in undamped strong ringing. In the simulation 600B of FIG. 6B, however, the carrier transport effect resulting from injecting carrier through the SCH delays the carriers, and thereby damps the oscillator and reduces ringing.

Thus, in the simulation 600B of FIG. 6B, overflow in the p-side SCH increases for both electrons and holes. The electrons are attracted by the holes and overflow into the SCH for high bias condition. For the 1-to-0 transition, electrons discharge from the SCH and flow back to the QW. There is very efficient damping of undershooting for the 1-to-0 transition for AM, e.g., as can be seen from the damping in undershooting for the Photon time series. There is still undershooting for the 1-to-0 transition for FM, e.g., as can be seen from the undershooting for the TotalChirp time series. The damping is not very efficient for the 0-to-1 transition overshooting because speed of charging the SCH is slower than the relaxation oscillation frequency $f_r$.

In this and other embodiments, the relaxation oscillation frequency $f_r$ may be at least 12 GHz, or at least 16 GHz, or even higher. Alternately or additionally, in this and other embodiments, damping caused by carrier transport effect tin eh gain section may be at least 12 GHz.

Conventional wisdom regarding high-speed (e.g., about 10 G or higher) DMLs is to limit SCH thickness to less than 50 nm, and more typically to use an SCH thickness of about 35 nm because the thicker SCH can negative affect the high-speed performance of the laser. In the embodiments described herein, however, SCH thickness of 60 nm to about 125 nm may be used to damp transient chirp and improve the eye after transmission through dispersive fiber for both DBR lasers and/or DFB lasers. Thus, while the example embodiments generally described and/or depicted herein relate to DBR lasers, the principles disclosed herein may also apply to DFB lasers. For example, relatively thick SCH may be used in a DFB laser to damp transient chirp and improve the eye after transmission through dispersive fiber.

Figure 6C:
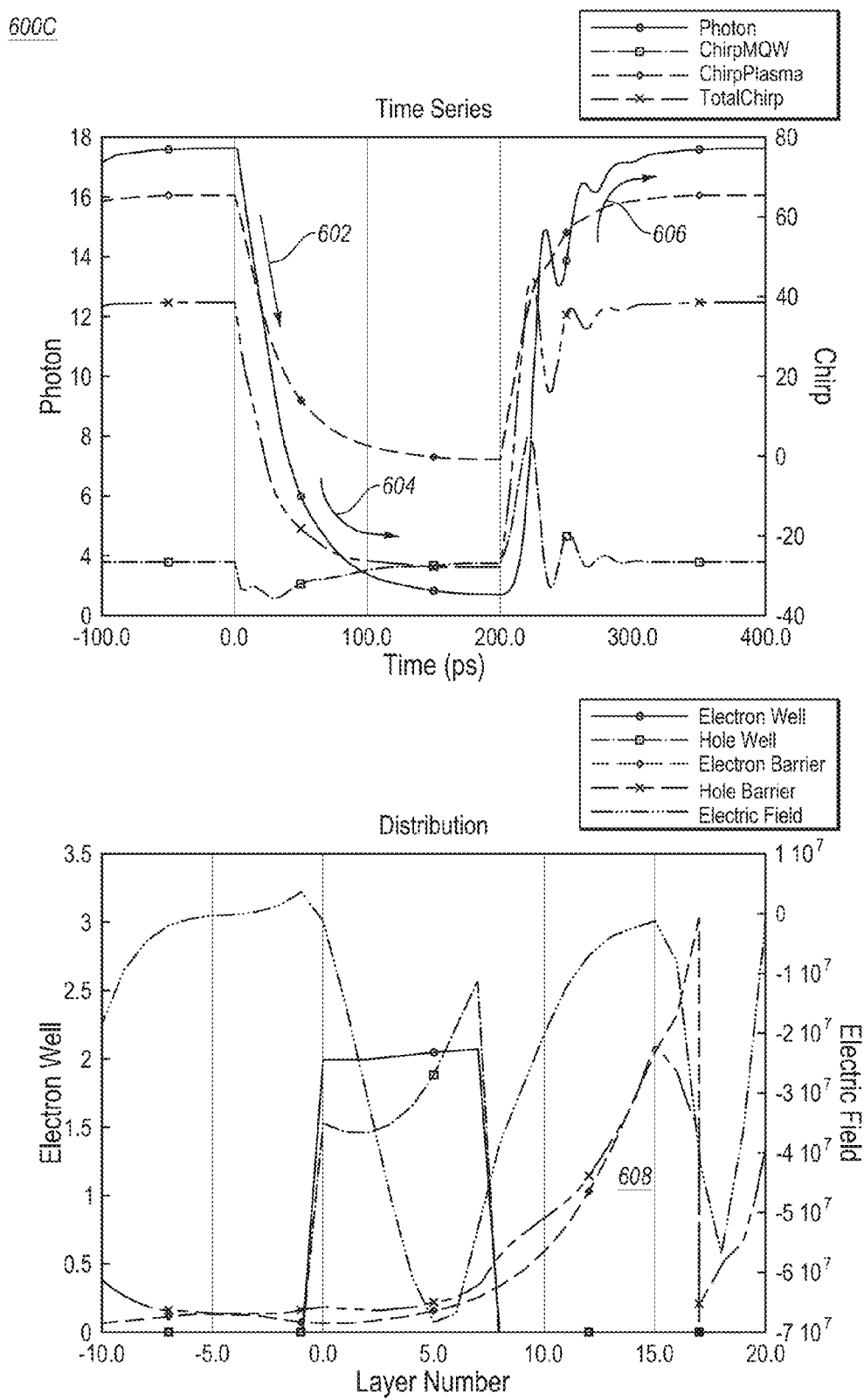

The parameters for the simulation 600C of FIG. 6C are provided in Table C below.

TABLE C

| Parameter: | Value: |
|---|---|
| electron capture time | 1.0 ps |
| hole capture time | 0.3 ps |
| hole overflow → hole escape time 3 ps | 10% |
| electron mobility | 2500 cm^2/V/s |
| hole mobility | 30 cm^2/V/s |
| electron tunneling time | 0.134 ps |
| hole tunneling time | 4.0 ps |

Compared to the simulation 600B of FIG. 6B, the carrier transport or SCH effect is even stronger in the simulation 600C of FIG. 6C. For instance, the hole overflow is increased from 0.1% to 10% by decreasing hole escape time from 300 ps to 3 ps, and the hole mobility is decreased from 180 cm$^2$/V/s to 30 cm$^2$/V/s. The foregoing modified parameters correspond to an SCH thickness of 100 nm. The carrier transport effect further damps the ringing in the time series simulations of FIG. 6C.

For example, as illustrated in the time series simulations of FIG. 6C and as compared to FIG. 6B, there is very efficient damping of undershooting or ringing for the 1-to-0 transition as denoted at 602; indeed, ringing for the 1-to-0 transition is completely removed. However, there is relatively slow fall—as denoted at 604—which may create intersymbol interference (ISI). There is also slow rise for AM at the 0-to-1 transition created by charging of the SCH, as denoted at 606. The damping for FM is not very efficient for the 0-to-1 overshooting because the speed of charging the SCH is slower than the relaxation oscillation frequency. As illustrated in the distribution simulations of FIG. 6C and as compared to FIG. 6B, and as denoted at 608, the overflow in the p-side SCH increases even further for both electrons and holes due to the relatively faster hole escape time and slower hole mobility.

Figure 6D:
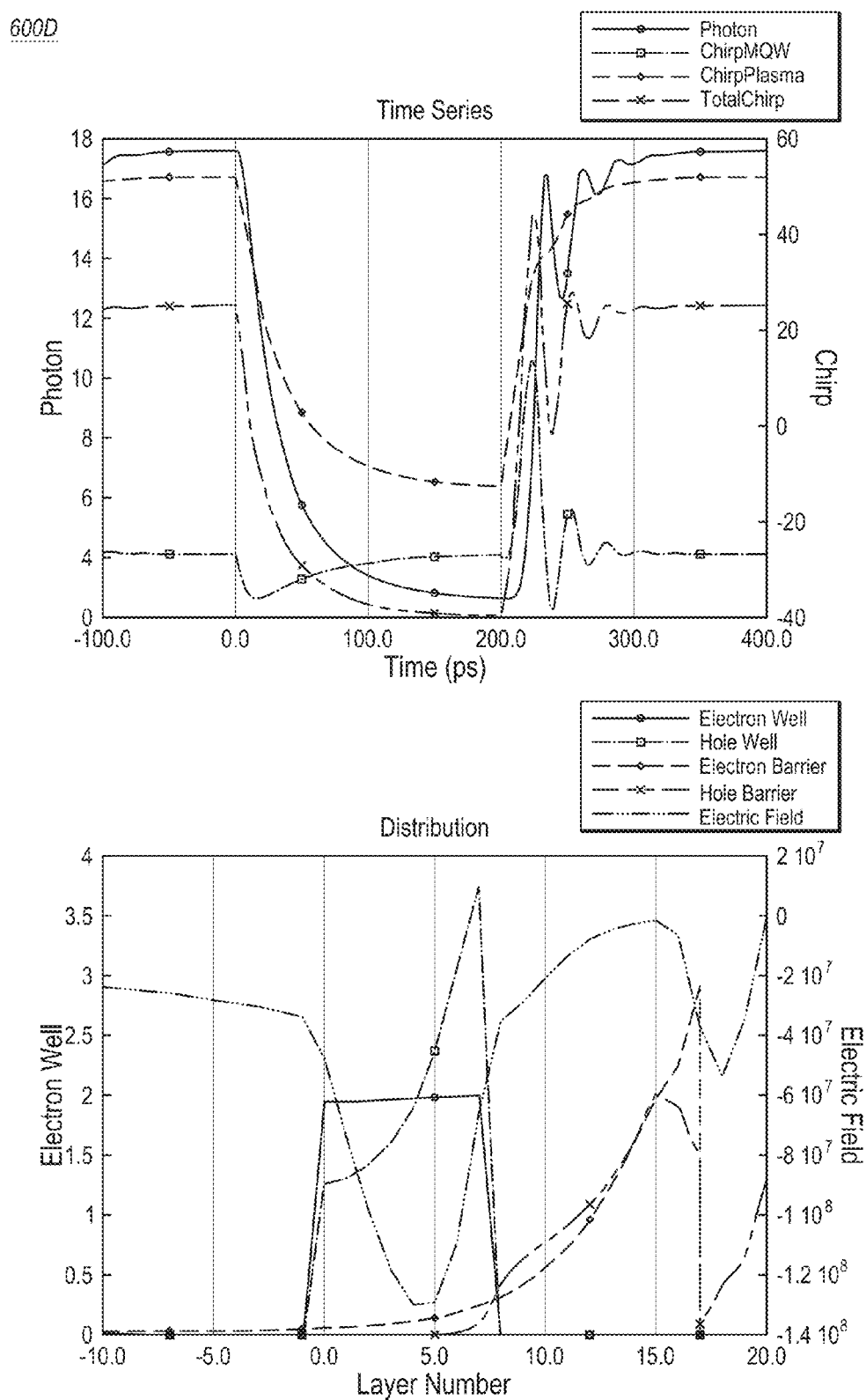

The parameters for the simulation 600D of FIG. 6D are provided in Table D below.

TABLE D

| Parameter: | Value: |
|---|---|
| electron capture time | 1.0 ps |
| hole capture time | 0.3 ps |
| hole overflow → hole escape time 300 ps | 0.1% |
| electron mobility | 2500 cm^2/V/s |
| hole mobility | 30 cm^2/V/s |
| electron tunneling time | 0.134 ps |
| hole tunneling time | 4.0 ps |

Compared to the simulation 600C of FIG. 6C, the hole escape time is slower in the simulation 600D of FIG. 6D. In particular, the hole escape time is increased from 3 ps to 300 ps, causing a decrease in the hole overflow from 10% to 0.1%.

The slower hole escape time creates a very strong hole non-uniformity as illustrated by the Hole well distribution of FIG. 6D. Moreover, an initial dip for both AM and FM in the time series simulations after an initial rise at the 0-to-1 transition is more pronounced as compared to FIG. 6C.

Figure 6E:
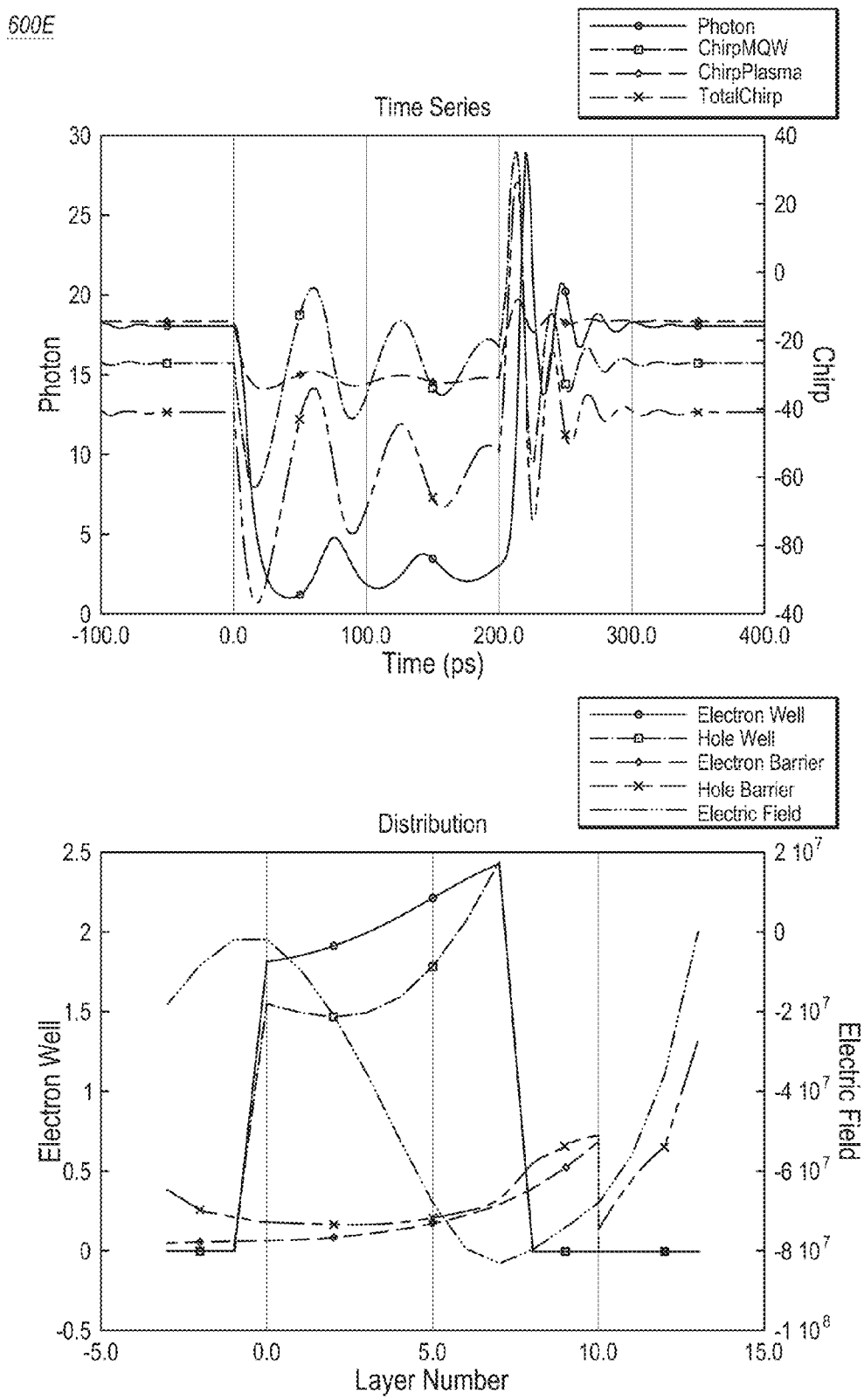

The parameters for the simulation 600E of FIG. 6E are provided in Table E below.

TABLE E

| Parameter: | Value: |
|---|---|
| electron capture time | 1.0 ps |
| hole capture time | 0.3 ps |
| hole overflow → hole escape time 3 ps | 10% |
| electron mobility | 2500 cm$^2$/V/s |
| hole mobility | 30 cm$^2$/V/s |
| electron tunneling time | 0.134 ps |
| hole tunneling time | 4.0 ps |

Compared to the simulation 600D of FIG. 6D, the carrier transport effect is weaker. For instance, the hole overflow is increased from 0.1% to 10% by decreasing hole escape time from 300 ps to 3 ps. The foregoing parameters in Table E correspond to an SCH thickness of 48 nm. As seen in the time series simulations, ringing is present because the SCH is too thin, resulting in too much transient chirp, notwithstanding substantially uniform injection. In this example, the SCH is not thick enough to store sufficient charge to damp the ringing.

Figure 6F:
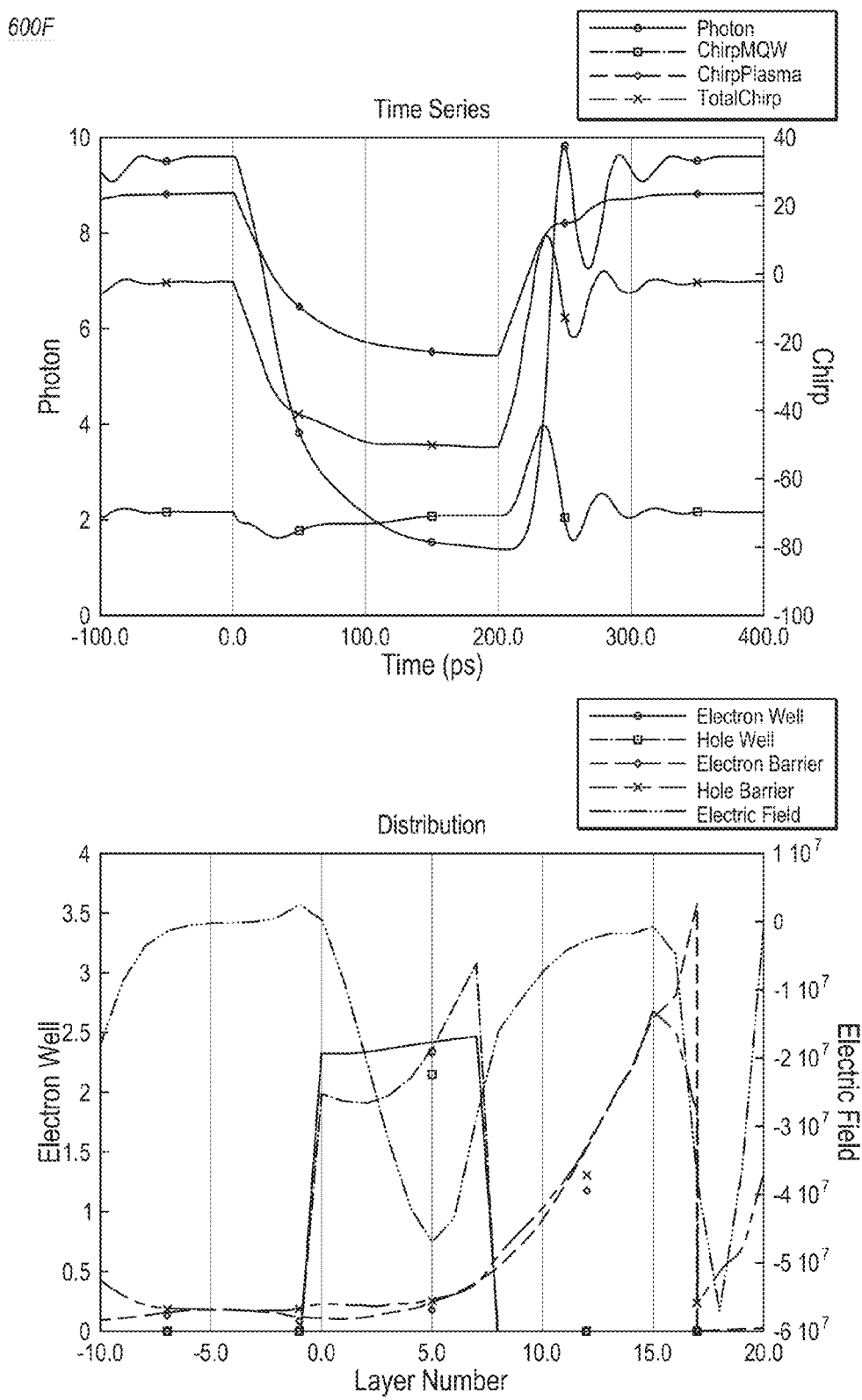

The parameters for the simulation 600F of FIG. 6F are provided in Table F below.

TABLE F

| Parameter: | Value: |
|---|---|
| electron capture time | 1.0 ps |
| hole capture time | 0.3 ps |
| hole overflow → hole escape time 3 ps | 10% |
| electron mobility | 2500 cm$^2$/V/s |
| hole mobility | 30 cm$^2$/V/s |
| electron tunneling time | 0.134 ps |
| hole tunneling time | 4.0 ps |

The parameters in Table F for the simulation 600F of FIG. 6F are identical to the parameters in Table E for the simulation 600E of FIG. 6E. However, the simulation 600F of FIG. 6F considers the dynamic photon lifetime effect in the form of dynamic loss for the QWs. In this simulation, optical loss due to IVBA may change dynamically. On the fall, e.g., on the 1-to-0 transition, N and S are in phase according to the rate equations model 200 of FIG. 2A. A reduction of N reduces the IVBA loss, which is an effective increase in gain for lowering S. This has the same effect as gain compression, so damping increases compared to FIG. 6E.

Figure 6G:
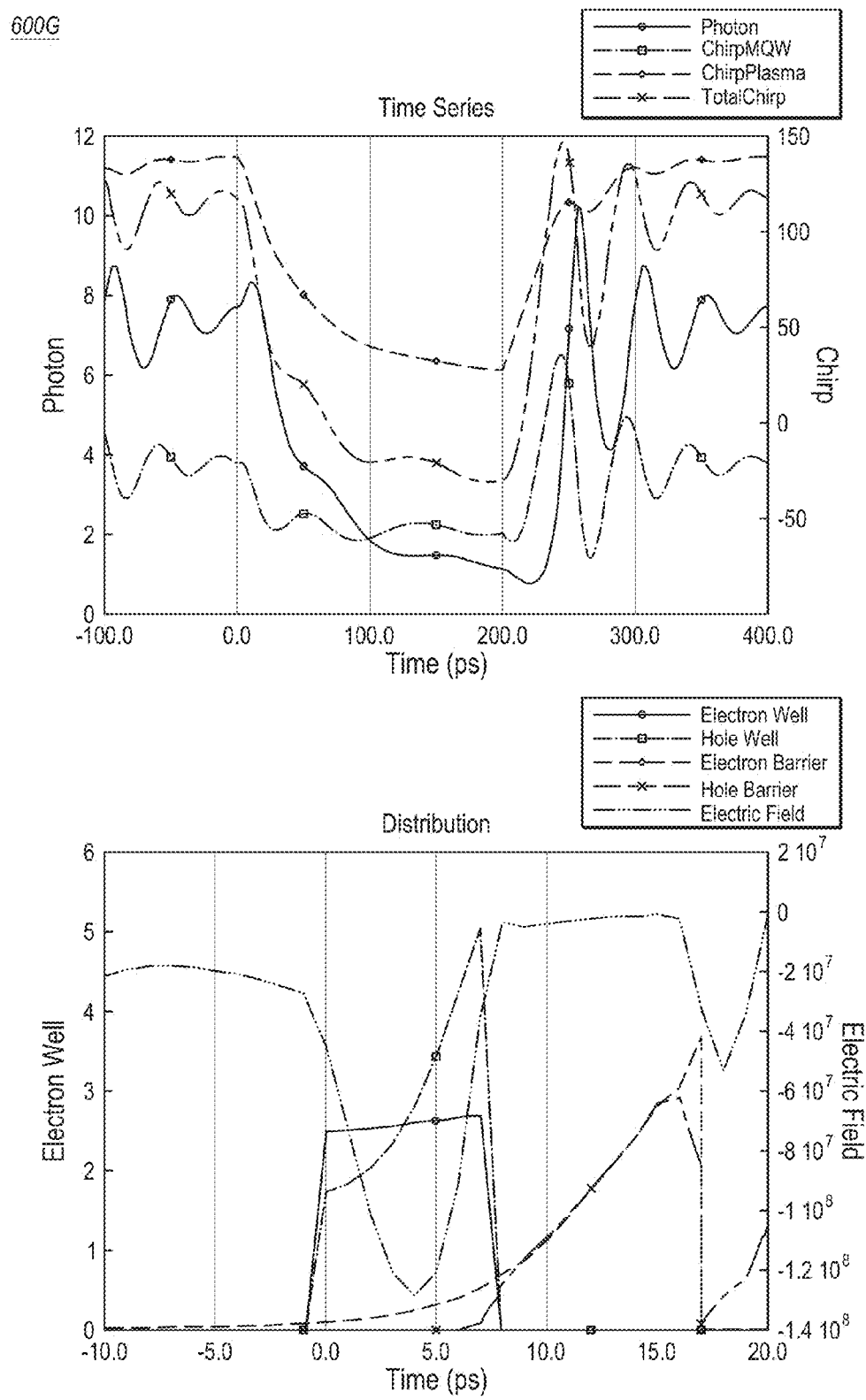

The parameters for the simulation 600G of FIG. 6G are provided in Table F below.

TABLE G

| Parameter: | Value: |
|---|---|
| electron capture time | 1.0 ps |
| hole capture time | 0.3 ps |
| hole overflow → hole escape time 300 ps | 0.1% |
| electron mobility | 2500 cm$^2$/V/s |
| hole mobility | 30 cm$^2$/V/s |
| electron tunneling time | 0.134 ps |
| hole tunneling time | 4.0 ps |

Compared to the simulation 600F of FIG. 6F, the hole escape time is slower in the simulation 600G of FIG. 6G. In particular, the hole escape time is increased from 3 ps to 300 ps, causing a decrease in the hole overflow from 10% to 0.1%. Thus, the simulation of FIG. 6G combines relatively slow hole escape time with dynamic IVBA. The slower hole escape time creates a strong hole non-uniformity as illustrated by the Hole well distribution of FIG. 6G. On the rise, e.g., on the 0-to-1 transition, N and S are out of phase according to the rate equations model 200 of FIG. 2A. As can be seen from the distribution simulations, when the stored charge in the SCH is high, the escape time makes a difference.

Accordingly, high-speed directly modulated DBR lasers may be configured with relatively thick SCH to damp ringing as described herein and thereby reach transmission distances of 20 km, 21 km, 25 km, or even further. In contrast, conventional high-speed DMLs such as distributed feedback (DFB) lasers typically used in DML applications may be limited to a reach of 5-10 km.

Figure 7:
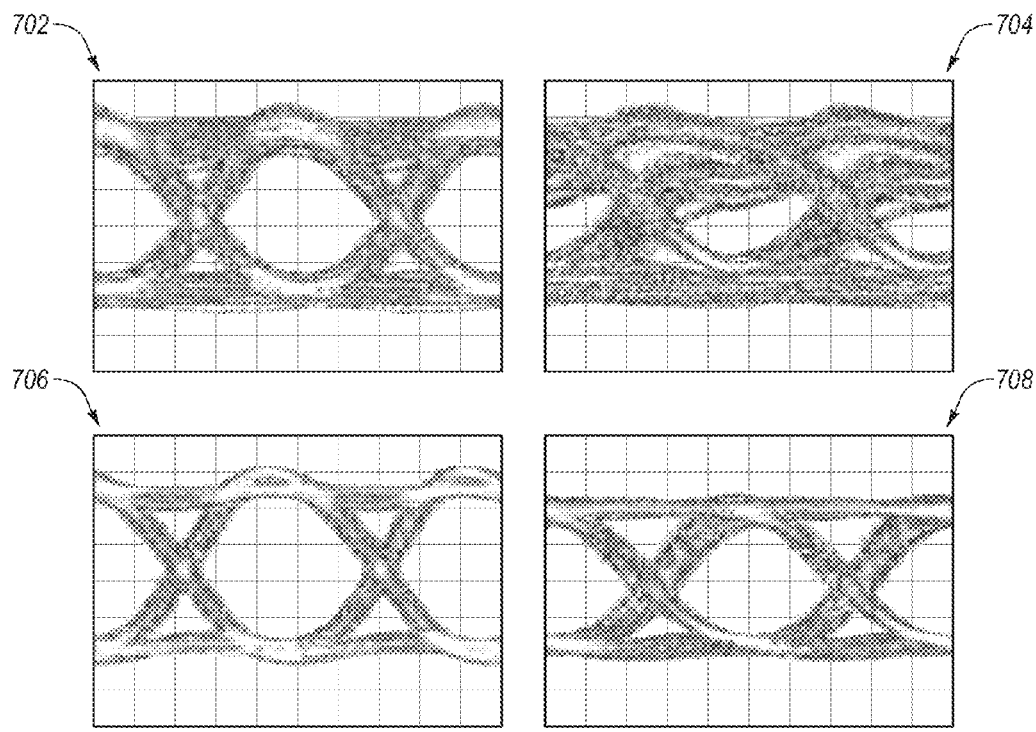
FIG. 7 illustrates eye diagrams for a directly modulated DFB laser and eye diagrams for a directly modulated DBR laser.

FIG. 7 illustrates eye diagrams 702, 704 for a directly modulated DFB laser and eye diagrams 706, 708 for a directly modulated DBR laser, such as the DBR lasers described above. The thickness of SCH used for the DFB laser was 60 nm. Both of the DFB laser and the DBR laser were modulated at a data rate of about 10 G. The eye diagram 702 is a measured BB eye diagram and the eye diagram 704 is a measured 10.5 km eye diagram, both for the DFB laser. As illustrated in FIG. 7, the eye diagram 704 is substantially closed after transmission through 10.5 km of dispersive fiber, leading to an unacceptably high bit error rate (BER).

The eye diagram 706 is a measured BB eye diagram and the eye diagram 708 is a measured 21 km eye diagram, both for the DBR laser. As illustrated in FIG. 7, the eye diagram 708 is substantially open even after transmission through 21 km of dispersive fiber. The BER for the eye diagram 708 is about −31 dBm received power at a BER of 1×10$^{-3}$ (FEC rate). An avalanche photodiode (APD) was used as the receiver.

Figure 8:
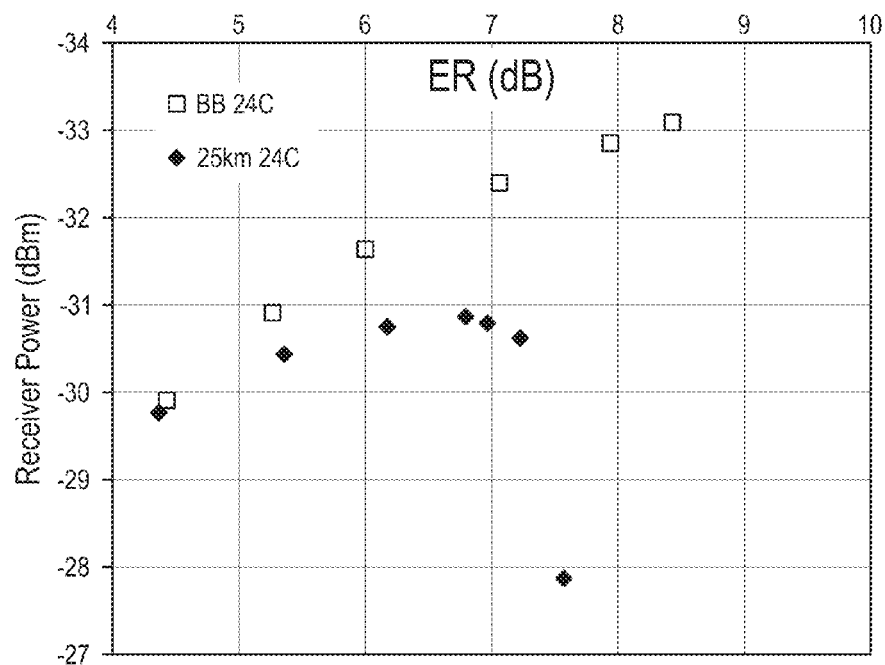
FIG. 8 illustrates receive power for various extinction ratios (ERs) changed by adjusting modulation amplitude for fixed DC bias for a directly modulated DBR laser.

FIG. 8 illustrates receive power for various ERs (horizontal axis) changed by adjusting modulation amplitude for fixed DC bias for a directly modulated DBR laser, such as the DBR lasers described above. The BER is fixed to 1×10$^{-3}$ (FEC rate). An APD was used as the receiver. This is a common setup and condition for passive optical network (PON) applications. FIG. 8 also shows that a received power of −31 dBm is good for a BER of 1×10$^{-3}$ after 25 km of transmission. The corresponding ER is 7 dB.

Figure 9:
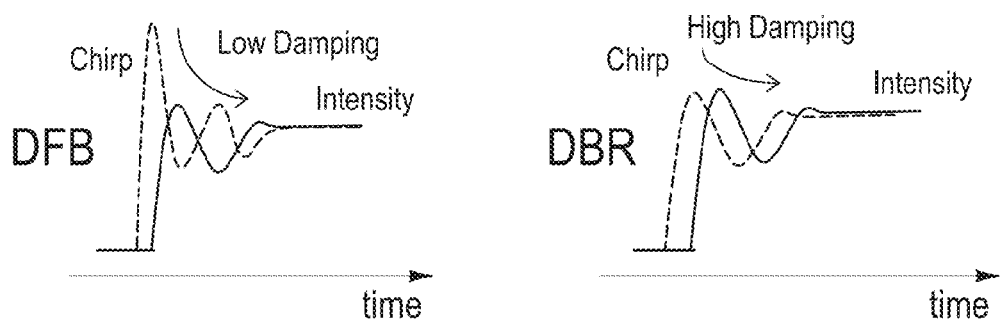
FIG. 9 illustrates relative damping for a DFB laser and a DBR laser.

With combined reference to FIGS. 7 and 8, the reason for the difference between the eye diagrams 704 and 708 after transmission for the DBR laser vs. the DFB laser and the improved BER for the DBR laser is that the DFB laser exhibits relatively small damping and strong transient chirp while the DBR laser exhibits relatively high damping and weak transient chirp, as illustrated in FIG. 9.

Damping factor $\Gamma$ depends on the K factor of the laser according to $\Gamma = K f_r^2 + cc$, where $f_r$ (also referred to herein as Fr) is relaxation oscillation frequency. The K factor may be calculated according to $$K = \frac{4\pi^2}{v_g}\left(\frac{1}{\alpha_{tot}} + \frac{\varepsilon}{dg}\right).$$

In DBR lasers, $\varepsilon$ occurs only in gain sections of the DBR laser and there is no gain in passive sections of the laser, so dg is relatively less in a DBR laser than in a DFB laser. Accordingly, the K factor is relatively greater for a DBR laser than for a DFB laser. Further, $\Gamma$ increases with increasing K factor. In some embodiments, both the K factor and $f_r$ may be maximized for the DBR laser. $f_r$ is proportional to the square root of the differential gain. After including both effects, one may find an advantage of higher differential gain, small loss of cavity, and large gain compression factor to achieve large damping factor. A high differential gain may be achieved by high quality growth of MQW structure with strain, a use of InGaAlAs barriers to increase electron confinement, for example. Lower loss of cavity can be achieved by increasing a mirror reflectivity of the DBR laser and optimizing p-doping in an InP clad (also referred to herein as a cladding layer). To increase gain compression factor without degrading speed performance, the carrier transport effect can be used in a relatively thick SCH as already described above.

Figure 10:
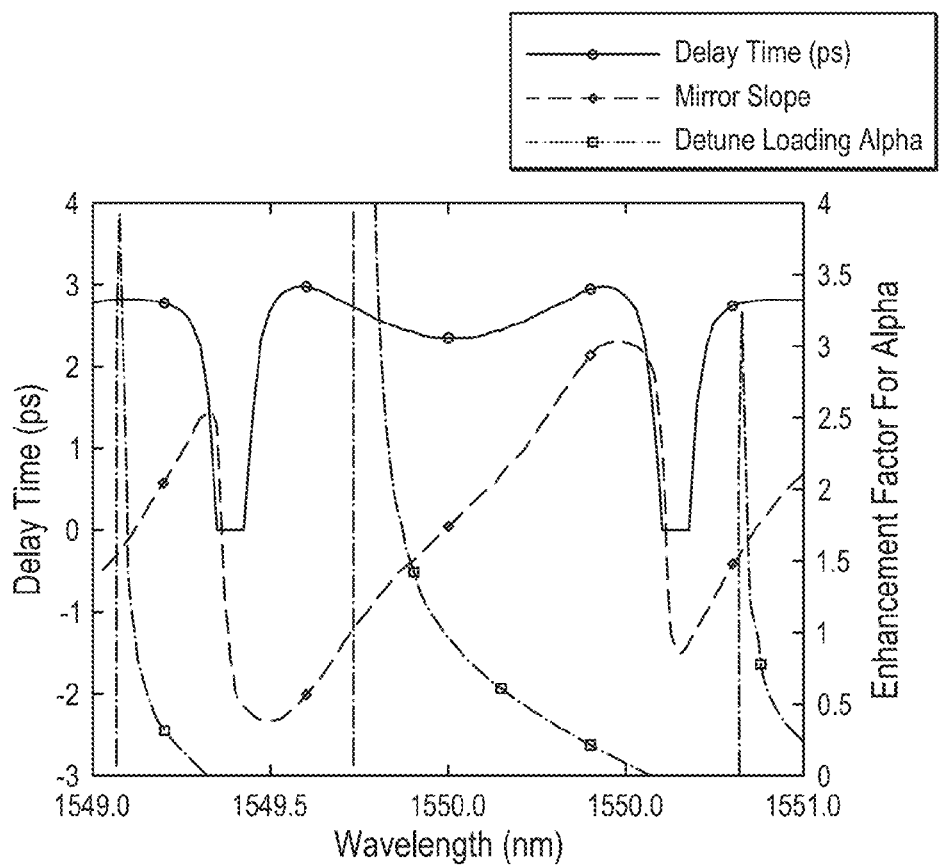
FIG. 10 is a graph depicting delay time, mirror slope, and detune loading alpha, all as a function of wavelength, for an example embodiment of a DBR laser.

As mentioned previously, the detune-loading effect may be leveraged to improve the performance of a DBR laser, such as the DBR lasers already described herein. In these and other embodiments, an effective alpha $\alpha_{eff}$ for the DBR laser may be reduced as the mode is tuned to the longer wavelength side of a Bragg peak associated with the DBR laser. FIG. 10 is a graph depicting delay time, mirror slope, and detune loading alpha, all as a function of wavelength, for an example embodiment of a DBR laser.

Figure 11:
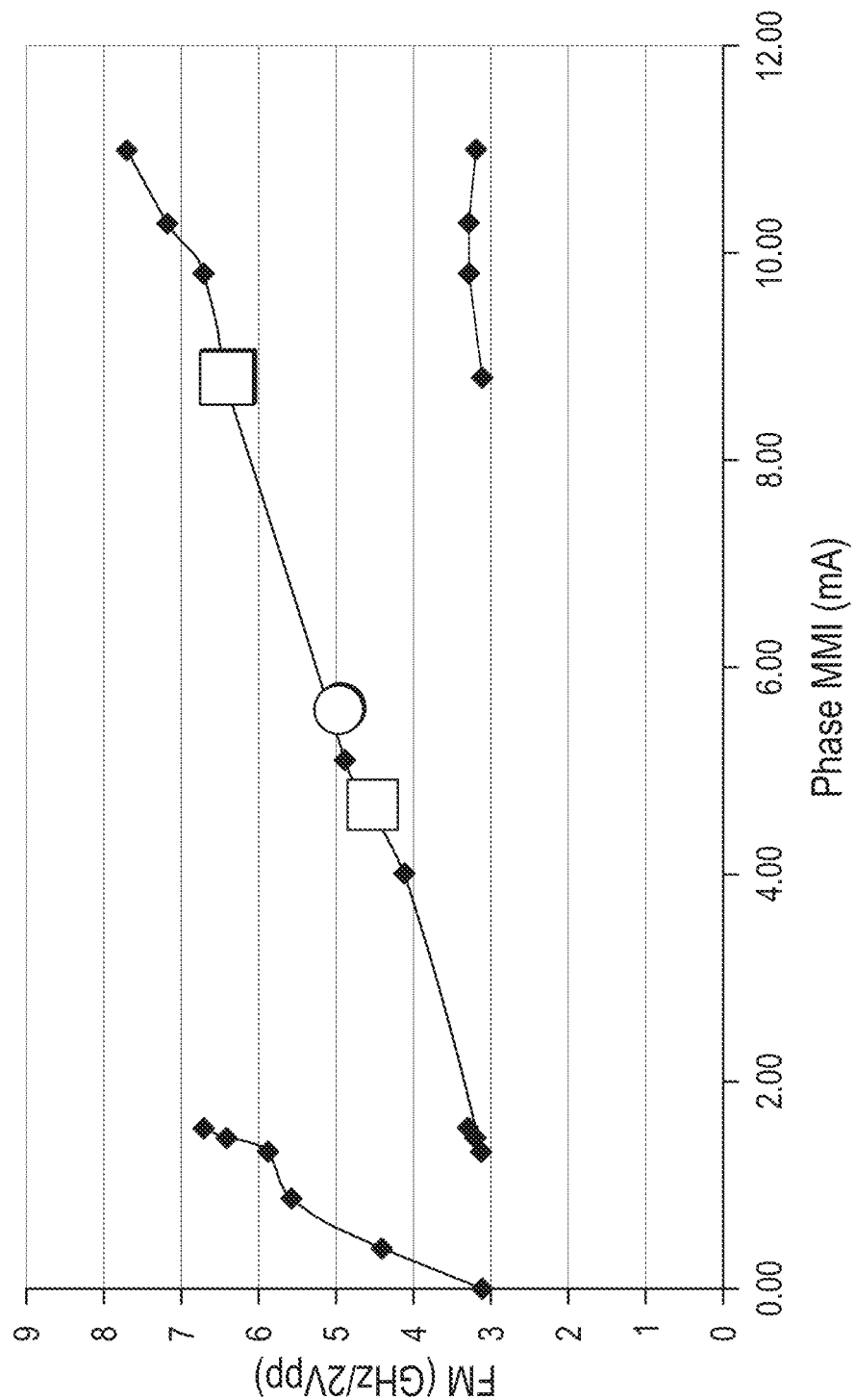
FIG. 11 is a graph depicting measured FM efficiency as a function of phase condition of an example embodiment of a DBR laser.

FIG. 11 is a graph depicting measured FM efficiency as a function of phase condition of an example embodiment of a DBR laser. Phase currents in a range from about 1-2 mA and in a range from about 9-11 mA show hysteresis regions where short-wavelength mode (high FM) is selected as phase current is ramped up from low to high current while long-wavelength mode (low FM) is selected as phase current is ramped down from high to low phase current. Stable single mode operation was obtained from a phase current range of about 2-8 mA. For phase current in a range from about 2-4 mA, lasing happened on the longer wavelength side of the corresponding Bragg peak, and the corresponding FM efficiency is lower. Although not shown in this graph, the corresponding Fr is higher, as is expected from the detune-loading effect, in this operating condition. Such operation condition may be applied for extending the reach by direct modulation of the DBR laser because 1. FM efficiency is lower, 2. Fr is higher, and therefore transient chirp can be suppressed to a greater extent.

In view of the foregoing, some embodiments described herein include a directly modulated DFB and/or DBR laser configured to operate at a data rate of about 10 G or higher with a reach of 25 km and which may be used in high-power PONs. To obtain a reach of 25 km with an acceptable BER at 10 G in a directly modulated DFB and/or DBR laser, transient chirp may be reduced compared to the transient chirp in a conventional 10 G DFB laser as already described herein.

Alternately or additionally, the DFB and/or DBR laser may include one or more of the following features:

First, the DFB and/or DBR laser may have a relatively high bias with a bias current density of about 0.2 mA/um or higher, e.g., 60 mA bias for 300 um gain length (1.2 um mesa width) or higher. Biasing the laser with a high bias may increase the speed of the laser and reduce the damping of the laser. In these and other embodiments, the direct modulation source—such as a modulation driver—driving the laser may include a low-power-consumption linear amplifier which can generate a relatively large modulation swing of 60 mApp-90 mApp so that the laser can be biased high while still having a good ER.

Second, the laser may be a fast laser. For instance, some embodiments include a 10 G laser with a bandwidth (BW) of 20 GHz.

Third, the laser may include a thick SCH to induce carrier transport effect. For example, the SCH may have a thickness of between about 60 nanometers (nm) to about 125 nm, or about 100 nm in some embodiments. In contrast, other DFB and DBR lasers may have an SCH with a thickness of less than about 50 nm. The thicker SCH provided in the laser according to some embodiments may increase damping of relaxation oscillation and reduce chirp as compared to lasers with relatively thinner SCH.

Fourth, the laser may be a DBR laser as opposed to a conventional DFB laser with relatively thin SCH typically used in DML applications. The DBR laser may have relatively more passive section(s) than the DFB laser, which passive section may increase the damping of the DBR laser as compared to the damping of the DFB laser as described above.

Fifth, the detune-loading effect can be applied such that the phase condition (e.g., the lasing wavelength) of the DBR laser is tuned toward the long wavelength side of the Bragg peak associated with the DBR laser so as to increase the speed of the DBR laser. While doing so may reduce the damping factor, the benefit from the improvement in speed may outweigh the penalty from the reduction in the damping factor.

Sixth, a DBR can be provided on each side of the gain section of the DBR laser (e.g., in the front-rear configuration of FIG. 1C) to improve the yield of single mode operation. Monitoring photo currents from the DBRs can be used to monitor output power. By measuring the ratio of photo currents from the front and rear DBRs, it may be possible to find the phase condition of lasing and avoid mode hop. Accordingly, embodiments described herein may involve adjusting the SCH thickness and/or carrier transport which changes internal, e.g., photon lifetime. By a combination of the foregoing, ringing and/or peaking may be adjusted to provide an appropriate amount of damping to extend the reach of directly modulated DBR laser.

When ringing is damped, the DBR laser may become a substantially linear device, which may be beneficial in analog applications where suppressing distortions is desirable. Applications in which a substantially linear directly modulated DBR laser may be implemented include discrete multi-tone (DMT) modulation and analog applications, among potentially others.

As described herein, the use of DBR lasers in DML applications may enable a reach of about 20 km or longer at 10 G data rates. The ER of lasers typically used in DML applications may be limited to about 5 dB, although some embodiments of the directly modulated DBR lasers described above may have an ER of between about 6.5-7 dB due to high modulation amplitude of current. Moreover, the power of directly modulated DFB lasers and/or DBR lasers may be somewhat limited in some embodiments due to a finite front facet reflectivity to form a laser cavity and by the available amplitude of modulation swing. Accordingly, some embodiments described herein may integrate an optical amplifier in a laser chip with semiconductor laser such as a DFB laser or a DBR laser to boost power and/or ER of the optical signals emitted from the chip as compared to optical signals emitted by laser chips lacking an integrated optical amplifier.

Figure 12A:
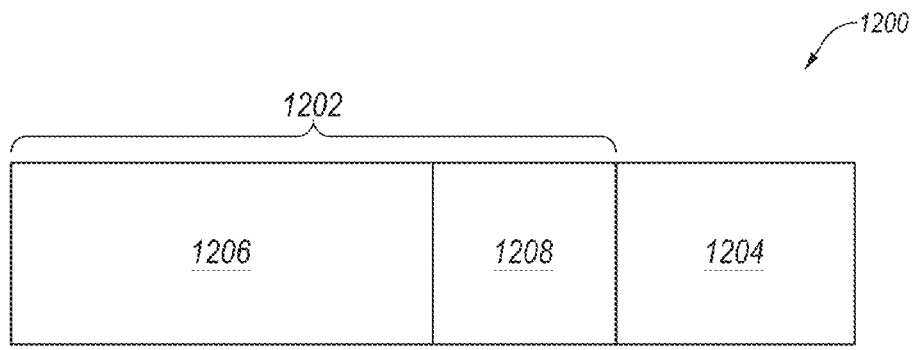
FIG. 12A illustrates an example embodiment of a laser chip including a DBR laser and an integrated optical amplifier.

Accordingly, FIG. 12A illustrates an example embodiment of a laser chip 1200 including a DBR laser 1202 and an integrated optical amplifier 1204, arranged in accordance with at least some embodiments described herein. According to some embodiments, the DBR laser 1202 and the optical amplifier 1204 may be co-modulated with the same modulation signal. Although the laser chip 1200 is illustrated as including a DBR laser integrated with an optical amplifier, in other embodiments the laser chip includes a DFB laser integrated with an optical amplifier.

In general, the DBR laser 1202 may be configured similar to the DBR lasers described above. For instance, in the illustrated embodiment, the DBR laser 1202 includes a gain section 1206 and a passive section 1208, similar to the DBR lasers 100, 110, 120 of FIGS. 1A-1C. The gain section 1206 may include an active region such as an MQW region which may be positioned between an upper and lower SCH and may otherwise be configured according to the embodiments described above. The passive section 1208 may include a DBR.

Figure 12B:
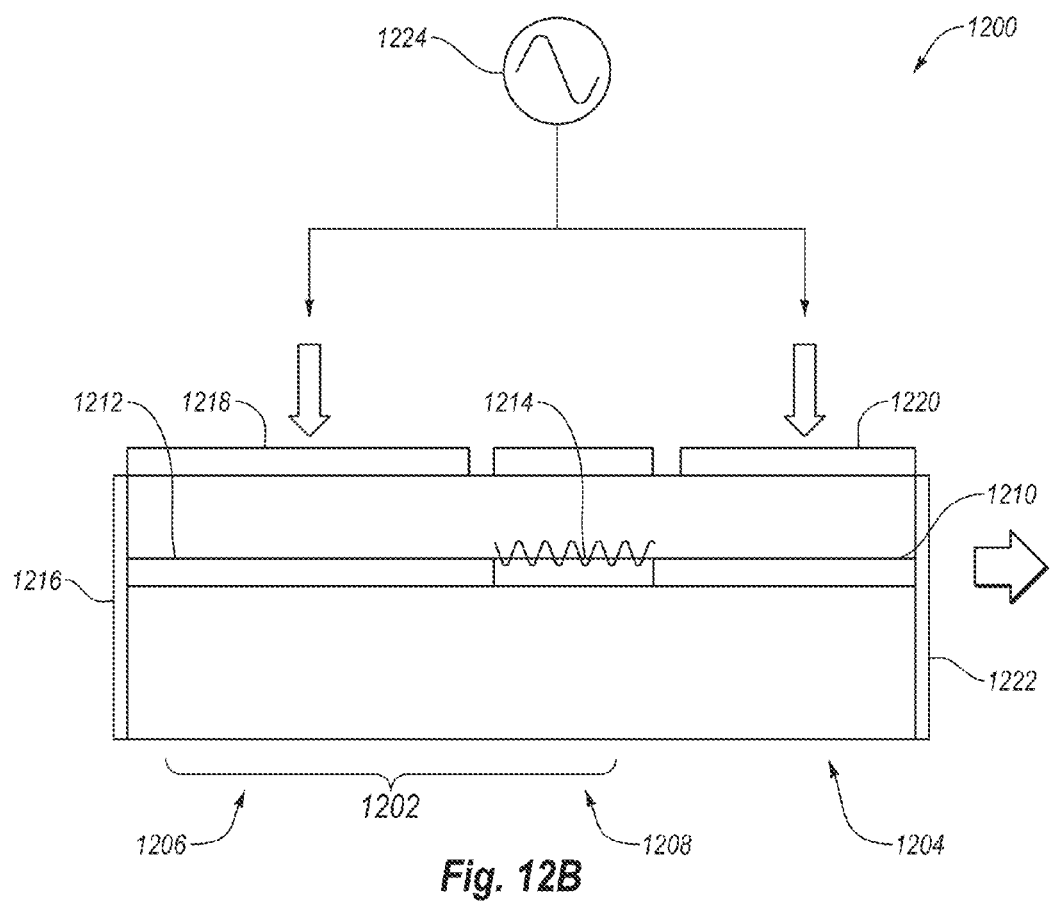
FIG. 12B illustrates an example embodiment of the laser chip of FIG. 12A in which the optical amplifier includes a semiconductor optical amplifier (SOA)

The optical amplifier 1204 may include, but is not limited to, a semiconductor optical amplifier (SOA), a multimode interference (MMI) SOA, or a Mach-Zehnder (MZ) modulator. For example, FIG. 12B illustrates an example embodiment of the laser chip 1200 of FIG. 12A in which the optical amplifier 1204 includes a SOA including an MQW region 1210. In this and other embodiments, the passive section 1208 is positioned between the gain section 1206 and the optical amplifier 1204 and a coupling between the passive section 1208 and the optical amplifier 1204 may include a butt joint coupling having an angle off normal incidence of an incoming optical signal generated by the DBR laser 1202.

FIG. 12B further illustrates a MQW region 1212 and a DBR 1214 that may be included in, respectively, the gain section 1206 and the passive section 1208 of the DBR laser 1202. In these and other embodiments, the laser chip 1200 may further include a common guiding structure within the DBR laser 1202 and the optical amplifier 1204, such as a shallow ridge or a buried heterostructure. In an example embodiment, the gain section 1206 may have a length of about 300 um and the optical amplifier 1204 may have a length of about 200 um.

In addition, the laser chip 1200 includes an HR coating 1216, a first electrode 1218 coupled to the gain section 1206 of the DBR laser 1202, a second electrode 1220 coupled to the optical amplifier 1204, and an AR coating 1222. In this and other embodiments, the first and second electrodes 1218, 1220 may be coupled to a common direct modulation source 1224. Accordingly, the gain section 1206 and the optical amplifier 1204 may be modulated with a common modulation signal supplied by the common direct modulation source 1224.

Figure 12C:
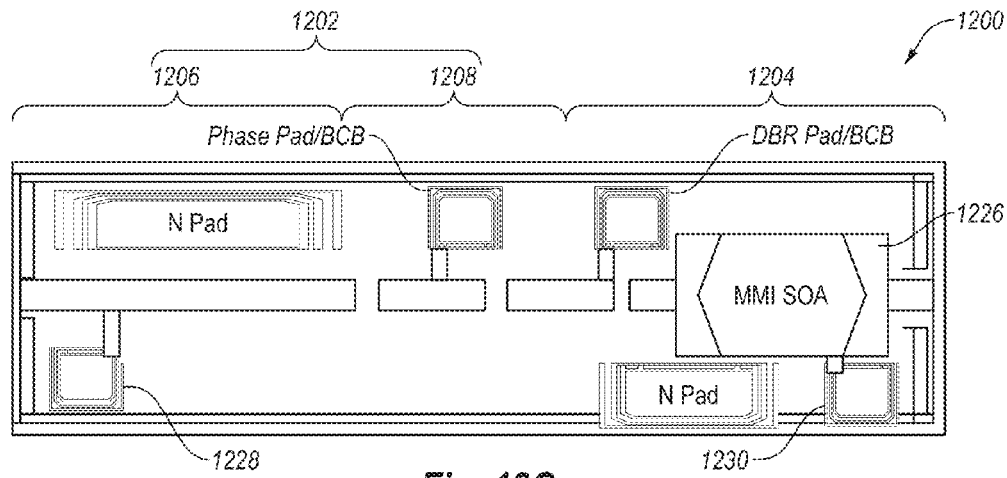
FIG. 12C illustrates an example embodiment of the laser chip of FIG. 12A in which the optical amplifier includes a multimode interference (MMI) SOA.

FIG. 12C illustrates an example embodiment of the laser chip 1200 of FIG. 12A in which the optical amplifier 1204 includes an MMI SOA 1226. FIG. 12C additionally illustrates a first electrode 1228 coupled to the gain section 1206 of the DBR laser 1202 and a second electrode 1230 coupled to the optical amplifier 1204. Although not illustrated in FIG. 12C, the first and second electrodes 1228, 1230 may be coupled to a common direct modulation source, such as the common direct modulation source 1224 of FIG. 12B.

Figure 12D:
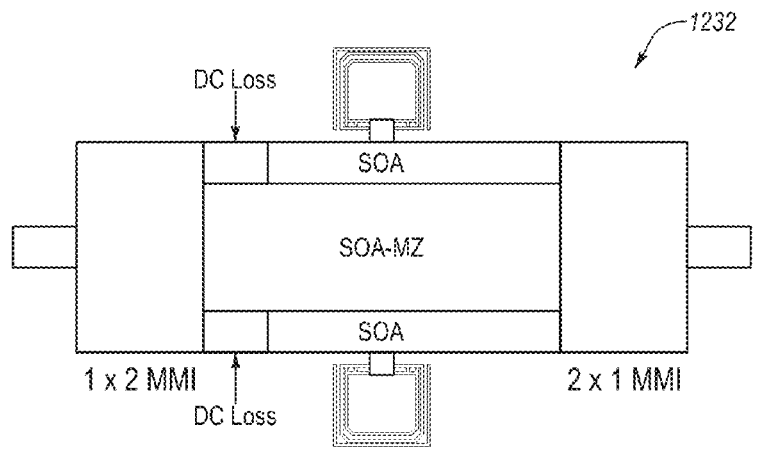
FIG. 12D illustrates an example embodiment of a first N-arm MZ modulator that may be implemented in the laser chip of FIG. 12C.
Figure 12E:
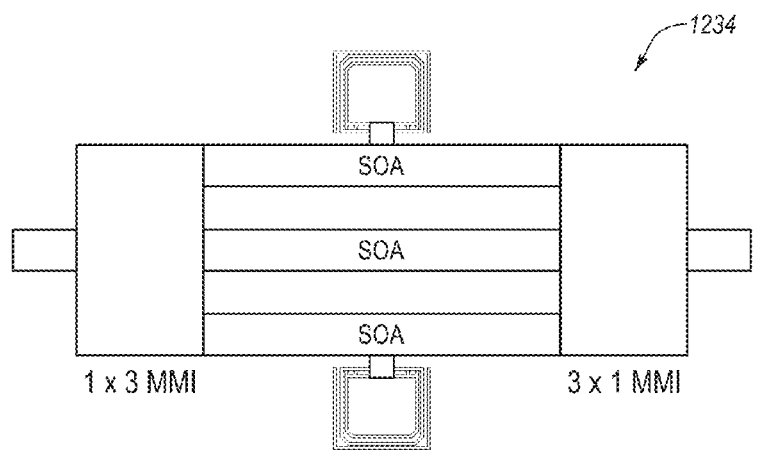
FIG. 12E illustrates an example embodiment of a second N-arm MZ modulator that may be implemented in the laser chip of FIG. 12C.

FIGS. 12D and 12E illustrate example embodiments of N-arm MZ modulators 1232, 1234, arranged in accordance with at least some embodiments described herein. In particular, the N-arm MZ modulator 1232 is a 2-arm MZ modulator, while the N-arm MZ modulator 1234 is a 3-arm MZ modulator. More generally, the number N of arms may be greater than 1. The N-arm MZ modulator 1232 of FIG. 12D may be included in the optical amplifier 1204 of FIG. 12C, e.g., in place of the MMI SOA 1226. Analogously, the N-arm MZ modulator 1234 of FIG. 12E may be included in the optical amplifier 1204 of FIG. 12C, e.g., in place of the MMI SOA 1226.

Figure 13:
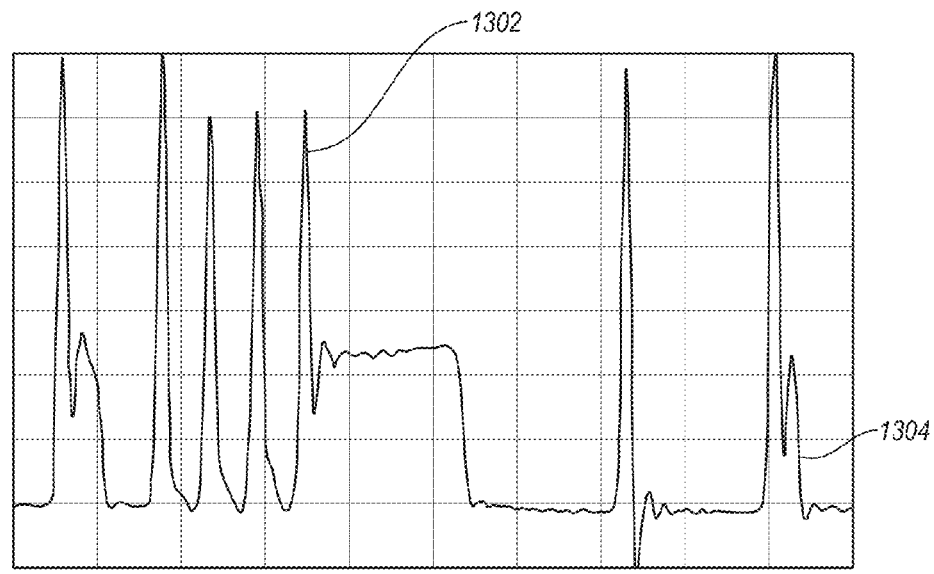
FIG. 13 is a graph including an AM profile of an optical signal transmitted through a SOA with high bias.
Figure 14:
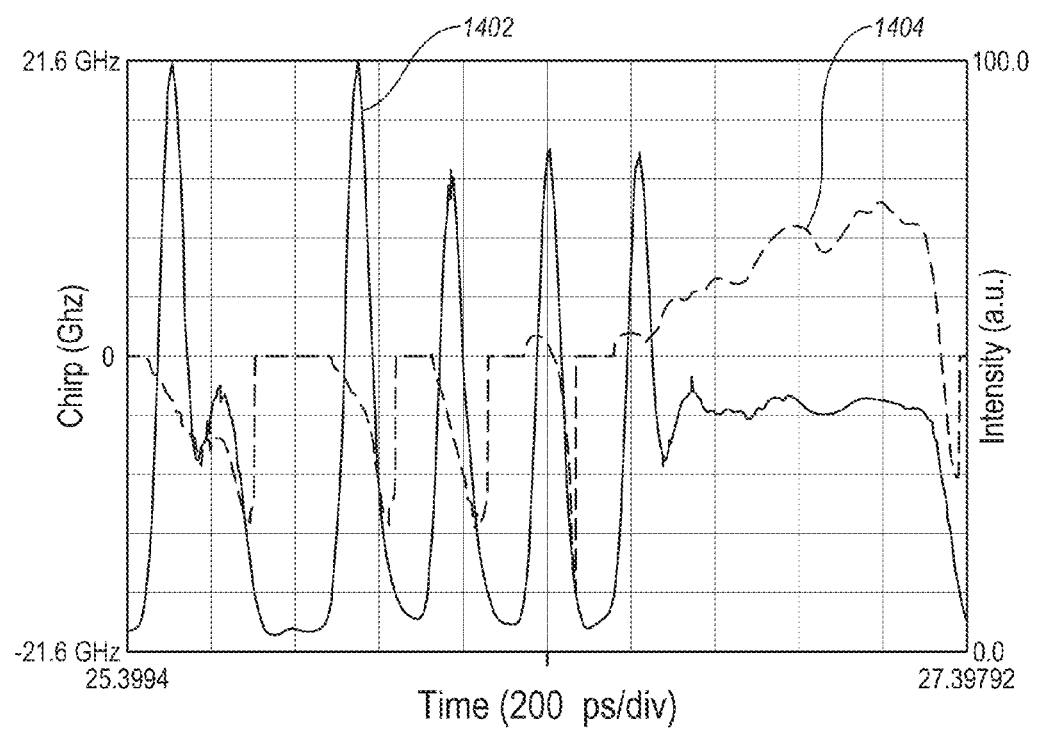
FIG. 14 illustrates an AM profile and an FM profile of an optical signal generated by a directly modulated laser after passing through a SOA under the same conditions as described with respect to FIG. 13.

SOAs under DC may distort AM optical signals. In particular, high bias to the SOA can cause AM peaking in the leading edge of relatively higher intensity 1 bits compared to lower intensity 0 bits, as denoted in FIG. 13 at 1302 in an AM profile 1304. The AM profile 1304 of FIG. 13 was obtained at an SOA bias of 60 mA DC, for an AM optical signal generated by a DBR laser biased at 58 milliamperes (mA) with a modulation swing of 90 mApp and at a data rate of about 10 G. FIG. 14 illustrates an AM profile 1402 and an FM profile 1404 of an optical signal generated by a directly modulated laser after passing through a SOA under the same conditions as described with respect to FIG. 13. Under the foregoing conditions, the SOA induces linear red chirp across each pulse in the optical signal as shown by the FM profile 1404 of FIG. 14, which chirp recovers at a time constant corresponding to carrier lifetime.

Figure 15:
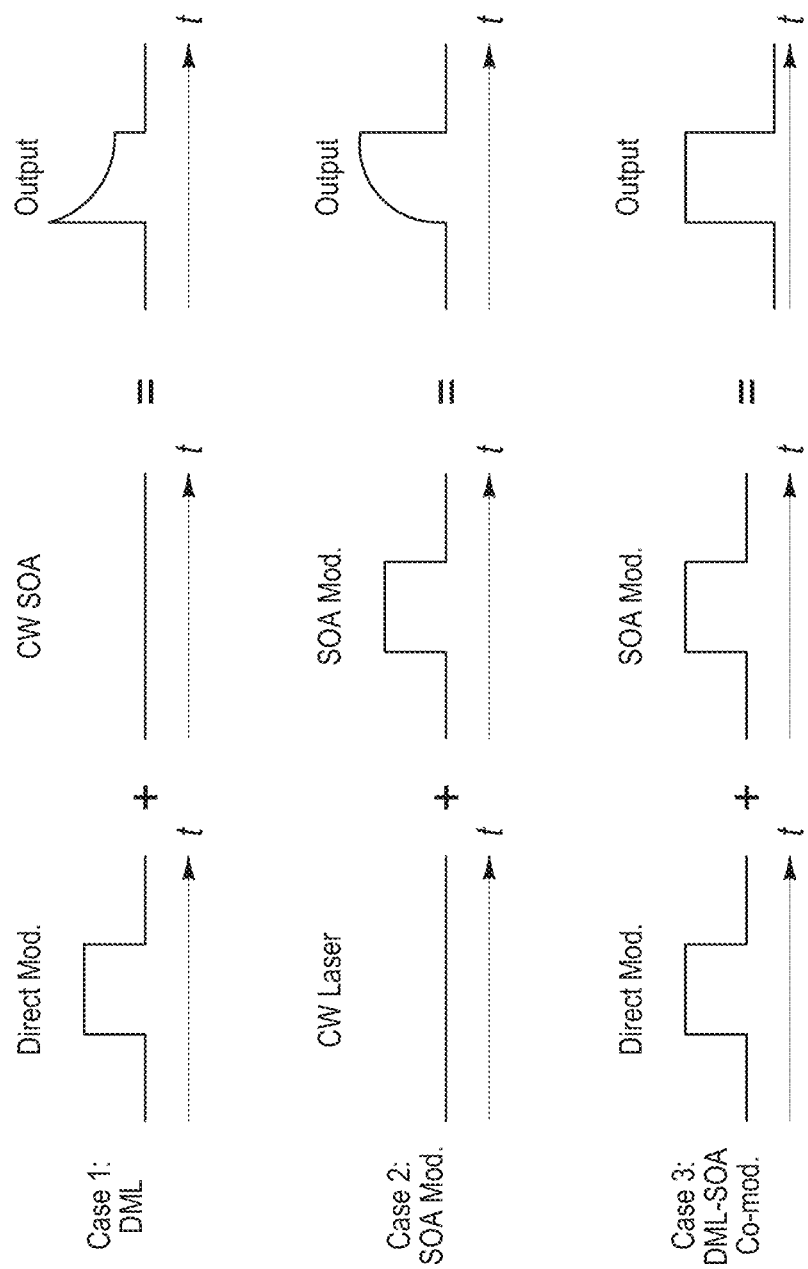
FIG. 15 illustrates 3 cases for operation of a DBR laser and a SOA.

FIG. 15 illustrates 3 cases for operation of a DBR laser and a SOA, arranged in accordance with at least some embodiments described herein. In case 1, an AM optical signal generated by a DML, such as a directly modulated DBR laser, passes through a DC-biased SOA. If the SOA is in the saturation regime (e.g., close to maximum power), the SOA causes distortion by amplifying only the leading edge efficiently.

In case 2, a continuous waveform (CW) optical signal passes through the SOA and the SOA is modulated. Usually, the speed of the SOA is not fast enough for a data rate of 10 G or higher due to limited speed of carrier lifetime. As a result, the intensity of the falling edge increases since the speed of the SOA is relatively slow.

In case 3, the DBR laser and the SOA are co-modulated with the same data signal such that the peaking at the leading edges as in case 1 may be neutralized by the peaking in the falling edges as in case 2 to generate an ideal or at least improved response, as generally illustrated in Case 3 and corresponding to the configuration of the laser chip 1200 depicted in FIG. 12B above. The peaking at the leading edges may be neutralized by the peaking in the falling edges since the time constant of case 1 and the time constant of case 2 naturally match as both are determined by carrier lifetime. In some embodiments, the high power injection of light into the SOA may increase the modulation speed of the SOA. Additionally, the ER of the output signal may be higher than the ER of the optical signal prior to transmission through the SOA if the depth of the co-modulation is optimized; otherwise, the ER of the output signal may be degraded.

Figure 16:
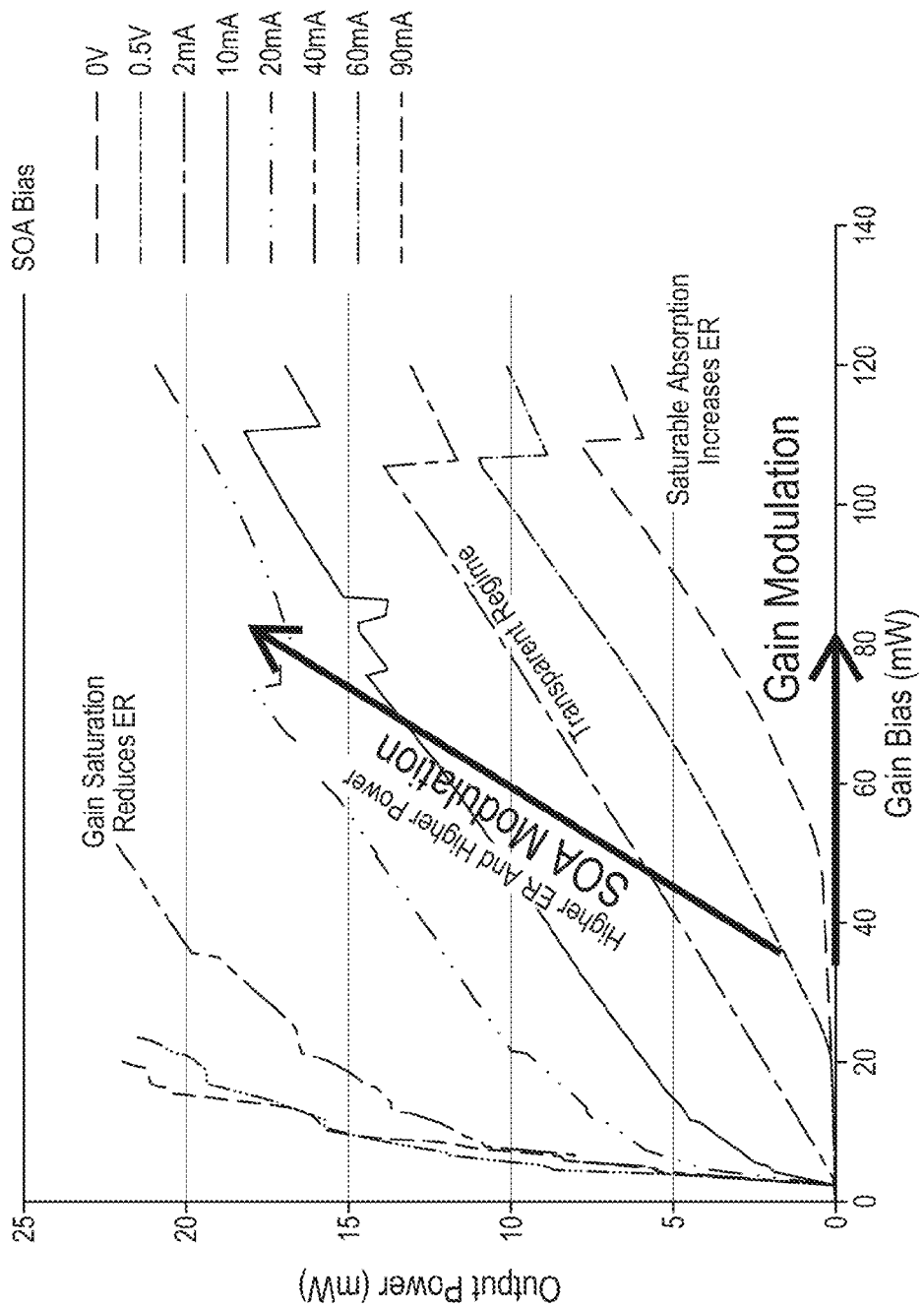
FIG. 16 is a graph indicating operating conditions that can be used to avoid ER degradation after a SOA.

A laser chip including a DBR laser and integrated optical amplifier, such as the laser chip 1200 described herein, can be tested under cw conditions. However, such testing may not indicate how the resulting waveform may look dynamically. Accordingly, FIG. 16 is a graph indicating operating conditions that can be used to avoid ER degradation after the SOA. For example, for cw bias to the SOA (e.g., no modulation to SOA is used), one fixed bias case for the SOA (having a length of 200 um in this case) can be analyzed. At 2 mA, the SOA may become transparent. Below 2 mA (e.g., 0 V or 0.5 V, below PN junction turn-on voltage, Vth=0.7 V), the SOA can function as a saturable absorber (e.g., saturation of absorption). When gain bias is increased, at the beginning (e.g., <50 mA gain, for 0V bias to SOA, see blue curve) there is no output because the SOA absorbs light. Absorption will be bleached when incoming power into the SOA exceeds certain power. The output power linearly increases for gain bias>60 mA in this case.

When the SOA bias is higher than 10 mA, significant saturation of gain is observed. Output power increases steeply at the beginning for low bias of gain, however, it quickly saturates (roll-over) for high gain bias. If the gain section of the DBR laser in a laser chip such as the laser chip 1200 is modulated, and the SOA is biased under cw condition, the ER at the output of SOA will degrade due to gain saturation in the SOA. To avoid ER degradation in the SOA in the gain saturation regime, according to some embodiments described herein, the SOA bias is modulated to higher current for the higher input (1 bits) while it is reduced for the lower input (0 bits). This is a so called "push-push" modulation scheme. In terms of module design, this can be simply implemented by splitting RF current into the gain section and the SOA (or other optical amplifier), and therefore, is a convenient modulation scheme to design a compact transmitter optical subassembly (TOSA) module.

For a PON application which requires 5-9 dBm fiber coupled power (called PR40 for EPON), the power of a laser chip including a DBR laser with a 300 um gain section length biased at 60 mA+SOA of length 200 um biased at 20 mA is high enough, as in this example. Use of a shorter device design, for example, 150 um gain section length for the DBR laser and 200 um SOA length with 20 mA bias, may enable a device packaged into a transistor outline (TO) CAN having limited heat load handling capability of a thermoelectric cooler (TEC). In particular, a laser chip such as the laser chip 1200 may be packaged with or without a TEC in a TO CAN.

The SOA length can be modified to be short enough (e.g., <300 um) to avoid undesirable distortion toward the end of the SOA. The shorter length of the SOA may be advantageous for suppressing distortion during amplification, although the gain of the SOA may be reduced.

High incident power into the SOA can improve the speed of the SOA by reducing the carrier lifetime of the SOA via faster stimulated emission time.

The facet reflectivity of the SOA can be finite or nearly 0%. Very low facet reflectivity on the SOA may be realized by use of an angled waveguide or window structure and may avoid complex modulation in the passive section caused by delayed feedback effect (e.g., self-seeding from close reflection plane), which is sometimes not desirable. When the phase condition of feedback is precisely controlled, however, the feedback effect can be used to damp relaxation oscillation to extend the transmission distance. One drawback is that such a condition can be sensitive to the phase condition of reflected light and may need feedback loop control. To avoid this drawback, two methods can be used. One is simply to eliminate the reflection at the facet as already mentioned. The other design is to use an angled waveguide at the output of the SOA to eliminate reflection from the facet, but add very low reflectivity grating near the output. In this case, the phase of feedback can be controlled by the grating phase and is more reproducible.

Thus, in a laser chip including a DBR laser and an integrated SOA such as is illustrated in FIG. 12B above, a higher ER after the SOA compared to the ER before the SOA can be achieved by simultaneously modulating the SOA with the same data modulating the gain section of the DBR laser. Simultaneously, the optical power after the SOA compared to the optical power before the SOA can be increased by the gain of the SOA.

Alternately, in the embodiment of FIG. 12C in which the laser chip 1200 includes a DBR laser 1202 and an MMI SOA 1226, the use of the MMI SOA 1226 increases the saturation output power compared to a non-MMI SOA since the photon density in the MMI gain section (e.g., the SOA) is reduced compared to the photon density at the input due to spreading of the mode area. The same principle applies to a 1×N or N-arm MZ modulator (N≥2) such as is illustrated in FIGS. 12D and 12E. The MMI SOA and/or the arms of the MZ modulator can be modulated in order to enhance the ER of the output signal compared to the input signal through interference of modes in the case of the MMI SOA or interference of recombined signal portions received from the various arms in the case of the 1×N MZ modulator.

The embodiments of FIGS. 12B-12E may include one or more of the following aspects, as applicable:

First, the guiding structure for both the DBR laser 1202 and the SOA included in the optical amplifier 1204 can include a shallow ridge or a buried heterostructure which is the same for both the DBR laser 1202 and the SOA to reduce coupling loss.

Second, the SOA can be used for the MMI gain section where the mode area is spread out, and therefore photon density is relatively lower, to avoid gain saturation of the SOA.

Third, a coupling between a passive section of the chip and the SOA gain material can include a butt joint coupling. The butt jointcoupling can have an angle off normal incidence of an incoming beam to avoid reflection.

Fourth, the electrode for an MMI SOA can be confined to the area where the mode is spread out.

Fifth, the MMI SOA can be co-modulated with the same data as the DBR laser similar to the description already provided with respect to configurations such as illustrated in FIG. 12B.

Sixth, in order to further enhance the ER at the output of an MZ modulator, one or more of the following may be implemented in the corresponding laser chip including a DBR laser and integrated optical amplifier: asymmetric splitting ratio in a corresponding MMI device, a section to control the loss in each arm (e.g., of an MZ modulator), or asymmetric DC bias or RF modulation to the SOA.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include, but not be limited to, systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include, but not be limited to, systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

In addition, where features or aspects of the disclosure are described in terms of Markush groups, those skilled in the art will recognize that the disclosure is also thereby described in terms of any individual member or subgroup of members of the Markush group.

As will be understood by one skilled in the art, for any and all purposes, such as in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art all language such as "up to," "at least," and the like include the number recited and refer to ranges which can be subsequently broken down into subranges as discussed above. Finally, as will be understood by one skilled in the art, a range includes each individual member. Thus, for example, a group having 1-3 cells refers to groups having 1, 2, or 3 cells. Similarly, a group having 1-5 cells refers to groups having 1, 2, 3, 4, or 5 cells, and so forth.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A distributed Bragg reflector (DBR) laser comprising:
   a gain section comprising:
      an active region;
      an upper separate confinement heterostructure (SCH) above the active region having a thickness of at least 60 nanometers (nm); and
      a lower SCH below the active region having a thickness of at least 60 nm; and
   a passive section coupled to the gain section, the passive section comprising a Bragg filter in optical communication with the active region.

2. The DBR laser of claim 1, further comprising a gain electrode coupled to the gain section, the gain electrode configured to be coupled to a direct modulation source providing a modulation signal having a data rate of about 10 gigabits per second or higher.

3. The DBR laser of claim 2, wherein in response to application of the modulation signal to the gain electrode, the DBR laser is configured to generate an optical signal having a frequency modulation profile exhibiting both transient chirp and adiabatic chirp, a ratio of transient chirp to adiabatic chirp being in a range from 1:3 to 1:4.

4. The DBR laser of claim 1, wherein a modulation signal applied to the gain section has a modulation swing of at least 40 milli amps peak-to-peak (mApp).

5. The DBR laser of claim 4, wherein the gain section has a length of 300 micrometers (um) or less.

6. The DBR laser of claim 5, wherein the modulation signal applied to the gain section has a modulation swing of about 60 mApp and the gain section has a length of about 200 um.

7. The DBR laser of claim 1, wherein the DBR laser has a reach of 21 kilometers or more with a bit error rate of about 1×10-3.

8. The DBR laser of claim 1, wherein the thickness of the upper SCH is less than 125 nm and the thickness of the lower SCH is less than 125 nm.

9. The DBR laser of claim 1, wherein the DBR laser is tuned toward a long wavelength side of a Bragg peak associated with the DBR laser.

10. The DBR laser of claim 1, wherein the DBR laser comprises a front DBR laser in which the passive section is positioned between the gain section and a front side of the front DBR laser having an antireflection (AR) coating.

11. The DBR laser of claim 1, wherein the DBR laser comprises a rear DBR laser in which the gain section is positioned between the passive section and a front side of the rear DBR laser having an antireflection (AR) coating.

12. The DBR laser of claim 1, wherein:
   the passive section comprises a first passive section;
   the Bragg filter comprises a first Bragg filter;
   the DBR laser further comprises a second passive section including a second Bragg filter in optical communication with the active region; and
   the gain section is positioned between the first passive section and the second passive section such that the DBR laser comprises a front/rear DBR laser.

13. The DBR laser of claim 1, wherein a relaxation oscillation frequency of the DBR laser is at least 12 gigahertz (GHz) and a damping caused by carrier transport effect in the gain section is at least 12 GHz.

14. The DBR laser of claim 13, wherein the relaxation oscillation frequency of the DBR laser is at least 16 GHz.

15. The DBR laser of claim 1, wherein:
   the thickness of the upper SCH is about 100 nanometers (nm);
   the thickness of the lower SCH is about 100 nm; and
   a K factor of the DBR laser is 0.32 nanoseconds (ns).

16. An optical transmitter comprising:
   a direct modulation source;
   a high-pass electrical filter coupled to the direct modulation source, the high-pass electrical filter having a time constant on the order of 1 nanosecond (ns); and
   a distributed Bragg reflector (DBR) laser coupled to the high-pass electrical filter, the DBR laser comprising:
      a gain section including:
         an active region;

an upper separate confinement heterostructure (SCH) above the active region having a thickness of at least 60 nanometers (nm); and a lower SCH below the active region having a thickness of at least 60 nm; and a passive section coupled to the gain section, the passive section including a Bragg filter in optical communication with the active region.

17. The optical transmitter of claim 16, wherein the high-pass electrical filter comprises a capacitor coupled in parallel with a first resistor, the parallel-coupled capacitor and first resistor being coupled in series with a second resistor.

18. The optical transmitter of claim 17, wherein the capacitor has a capacitance of about 50 picofarads (pF), the first resistor has a resistance of about 15 Ohms ($\Omega$), and the second resistor has a resistance of about 45$\Omega$.

19. The optical transmitter of claim 16, wherein:

the thickness of the upper SCH is about 125 nanometers (nm);

the thickness of the lower SCH is about 125 nm; and a K factor of the DBR laser is 0.34 nanoseconds (ns).

20. A distributed feedback laser comprising:

a gain section, the gain section including:

an active region;

an upper separate confinement heterostructure (SCH) above the active region having a thickness of at least 60 nanometers (nm); and a lower SCH below the active region having a thickness of at least 60 nm;

wherein the gain section is biased with a relatively high bias current density of at least 0.2 milli amps (mA) per micrometer (um).

* * * * *

UNITED STATES PATENT AND TRADEMARK OFFICE
CERTIFICATE OF CORRECTION

PATENT NO. : 8,908,734 B2  
APPLICATION NO. : 13/897282  
DATED : December 9, 2014  
INVENTOR(S) : Matsui Page 1 of 1

It is certified that error appears in the above-identified patent and that said Letters Patent is hereby corrected as shown below:

In the Specification

In Column 6, Line 26, delete "indium-gallium-alluminum-arsenide" and insert -- indium-gallium-aluminum-arsenide --, therefor.

In Column 8, Lines 6-7, delete "intervalance" and insert -- intervalence --, therefor.

In Column 8, Line 45, delete "lifetime;" and insert -- lifetime. --, therefor.

In Column 22, Line 11, delete "jointcoupling" and insert -- joint coupling --, therefor.

In the Claims

In Column 24, Line 23, in Claim 7, delete "1×10-3." and insert -- $1 \times 10^{-3}$. --, therefor.

Signed and Sealed this  
Twenty-ninth Day of September, 2015

Michelle K. Lee  
*Director of the United States Patent and Trademark Office*